(12) United States Patent
Ishikawa et al.

(10) Patent No.: US 10,930,720 B2
(45) Date of Patent: Feb. 23, 2021

(54) DISPLAY DEVICE AND MANUFACTURING METHOD THEREOF

(71) Applicant: Japan Display Inc., Tokyo (JP)

(72) Inventors: Miyuki Ishikawa, Tokyo (JP); Masashi Tsubuku, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 16/368,841

(22) Filed: Mar. 28, 2019

(65) Prior Publication Data

US 2019/0312062 A1 Oct. 10, 2019

(30) Foreign Application Priority Data

Apr. 4, 2018 (JP) .............. JP2018-072325

(51) Int. Cl.
| | |
|---|---|
| H01L 27/32 | (2006.01) |
| H01L 27/12 | (2006.01) |
| H01L 29/786 | (2006.01) |
| H01L 29/51 | (2006.01) |
| H01L 21/02 | (2006.01) |
| H01L 29/66 | (2006.01) |
| H01L 29/49 | (2006.01) |

(Continued)

(52) U.S. Cl.
CPC ........ *H01L 27/326* (2013.01); *H01L 21/0217* (2013.01); *H01L 21/02164* (2013.01); *H01L 21/02271* (2013.01); *H01L 27/1218* (2013.01); *H01L 27/1225* (2013.01); *H01L 27/1248* (2013.01); *H01L 27/1262* (2013.01); *H01L 27/3262* (2013.01); *H01L 29/4908* (2013.01); *H01L 29/518* (2013.01); *H01L 29/66969* (2013.01); *H01L 29/7869* (2013.01); *H01L 29/78648* (2013.01); *H01L 29/78696* (2013.01); *G02F 1/1368* (2013.01); *G02F 1/136227* (2013.01); *G02F 2001/13685* (2013.01); *H01L 27/3248* (2013.01); *H01L 27/3258* (2013.01)

(58) Field of Classification Search
CPC ............. H01L 27/1214; H01L 27/1222; H01L 27/1233; H01L 27/1251; H01L 27/3248; H01L 27/326; H01L 27/3262
See application file for complete search history.

(56) References Cited

U.S. PATENT DOCUMENTS

| | | | | |
|---|---|---|---|---|
| 8,115,206 B2* | 2/2012 | Sakakura | ................ | H01L 27/12 257/66 |
| 2008/0258141 A1* | 10/2008 | Park | .................. | H01L 29/78621 257/43 |
| 2017/0117374 A1 | 4/2017 | Tanaka | | |

FOREIGN PATENT DOCUMENTS

JP 2017-85079 A 5/2017

* cited by examiner

*Primary Examiner* — Eduardo A Rodela
(74) *Attorney, Agent, or Firm* — Xsensus LLP

(57) ABSTRACT

One embodiment of the invention is characterized as follows. A display device comprising: a display area including a plurality of pixels, each of the pixels has a first TFT and a second TFT, the first TFT and the second TFT comprise an oxide semiconductor, the first TFT and the second TFT are covered by an interlayer insulating film, a first through hole is formed in the in the interlayer insulating film to connect a drain of the first TFT, wherein a distance d1 between a center of the first through hole and an edge of a channel of the first TFT is shorter than a distance d2 between a center of the first through hole and an edge of a channel of the second TFT, a channel length of the first TFT is shorter than a channel length of the second TFT.

8 Claims, 23 Drawing Sheets

(51) Int. Cl.
*G02F 1/1362* (2006.01)
*G02F 1/1368* (2006.01)

DISPLAY DEVICE AND MANUFACTURING METHOD THEREOF

CLAIM OF PRIORITY

The present application claims priority from Japanese Patent Application JP 2018-072325 filed on Apr. 4, 2018, the content of which is hereby incorporated by reference into this application.

BACKGROUND OF THE INVENTION

(1) Field of the Invention

The present invention relates to a display device comprising TFTs (Thin Film Transistor) that use oxide semiconductors.

(2) Description of the Related Art

An organic EL display device has a driving transistor and a switching transistor, which are formed by TFTs (Thin Film Transistors), in each of the pixels. A liquid crystal display device has a switching transistor, which is formed by TFT, in each of the pixels. Since the organic EL display device has two or more TFTs in each of the pixels, a change of the characteristics between the TFTs becomes a problem.

The oxide semiconductor has high OFF resistance, thus, OFF current can be decreased when it is used in the TFT; consequently, a change of the potential of the pixel electrode can be decreased. In addition, the TFT formed by oxide semiconductor can be manufactured in a lower temperature process compared with the TFT formed by poly-silicon; thus, a display device comprising a resin substrate can be realized.

In the TFT using the oxide semiconductor can form the drain region and the source region by reducing the oxide semiconductor by hydrogen except the channel region. In this case, however, if the hydrogen diffuses into the channel, the TFT is depleted. The patent document 1 (Japanese patent application laid open 2017-85079) discloses to control the diffusion of hydrogen to maintain the characteristics of the channel, at the same time, at the same time, it discloses to diffuse the hydrogen supplied to the drain region and the source region to form a region having the same effect of the LDD (Lightly Doped Drain) region in the poly-silicon TFT, namely, forming a region, between the channel and the drain, which has lower resistance than that of the channel and higher resistance than that of the drain region and the source region.

SUMMARY OF THE INVENTION

Many insulating films are formed in the display device that uses TFTs. There are an organic insulating film and an inorganic insulating film in those insulating films. Silicon oxide film (it is represented by SiO film herein after) and silicon nitride film (it is represented by SiN film herein after) are representative ones in the inorganic insulating films. Both of the SiO film and the SiN film are formed by CVD (Chemical Vapor deposition).

The SiN film formed by CVD emits hydrogen when it is baked. If the hydrogen intrudes in the channel of the TFT formed by the oxide semiconductor, the oxide semiconductor is reduced, consequently, the characteristics of the TFT changes.

Especially, when the length of the channel of the TFT, in the direction between the source region and drain region, becomes short, this causes a serious problem; and in some cases, this causes the depletion of the TFT. However, since the SiN film has an excellent blocking effect against the moisture or the like, the SiN film is indispensable in the display device.

The purpose of the present invention is to realize the structure that can suppress the influence of the hydrogen, which is emitted from the SiN film or the like, to the characteristics of the oxide semiconductor.

The present invention solves the above problem; concrete structures are as follows:

(1) A display device comprising:

a display area having a plurality of pixels, each of the pixels has a first TFT and a second TFT, the first TFT and the second TFT comprise an oxide semiconductor, the first TFT and the second TFT are covered by an interlayer insulating film, a first through hole is formed in the in the interlayer insulating film to connect a drain of the first TFT, a distance d1 between a center of the first through hole and an edge of a channel of the first TFT is shorter than a distance between a center of the first through hole and an edge of a channel of the second TFT, a channel length of the first TFT is shorter than a channel length of the second TFT.

(2) A display device comprising:

a display area including a plurality of pixels, each of the pixels has a first TFT and a second TFT, the first TFT and the second TFT comprise an oxide semiconductor, the first TFT and the second TFT are covered by an interlayer insulating film, a first through hole is formed in the interlayer insulating film to connect a drain of the first TFT, a distance between a center of the first through hole and an edge of a channel of the first TFT is d1, a channel length of the first TFT is c11, a second through hole is formed in the interlayer insulating film to connect a drain or source of the second TFT, a distance between a center of the second through hole and an edge of a channel of the second TFT is d2, a channel length of the second TFT is c12, wherein given d1<d2, c11 <c12.

(3) A manufacturing method of a display device including a plurality of pixels, each of the pixels has a first TFT of an oxide semiconductor comprising:

forming an undercoat film comprising a first silicon nitride film and a first silicon oxide film, forming a first TFT on the undercoat film, forming an interlayer insulating film over the first TFT, forming a first through hole in the interlayer insulating film at a place corresponding to a drain or a source of the first TFT, wherein a channel length of the first TFT is set less than 4 μm when a distance between a center of the first through hole and an edge of a channel of the first TFT is less than 20 μm, the channel length of the first TFT is set 4 μm or more when a distance between a center of the first through hole and an edge of a channel of the first TFT is 20 μm or more.

DETAILED DESCRIPTION OF THE PREFERRED EMBODIMENTS

The present invention will be described in detail referring to the following embodiments. Examples of the oxide semiconductors are: IGZO (Indium Gallium Zinc Oxide), ITZO (Indium Tin Zinc Oxide), ZnON (Zinc Oxide Nitride), IGO (Indium Gallium Oxide), and so on. Among the oxide semiconductors, the transparent and non-crystalized oxide semiconductors are called TAOS (Transparent Amorphous Oxide Semiconductor). In this specification, the oxide semiconductor may be called as TAOS. The first embodiment through the fifth embodiment explains the present invention when it is applied to the organic EL display device; the sixth embodiment explains the present invention when it is applied to the liquid crystal display device.

First Embodiment

Figure 1:
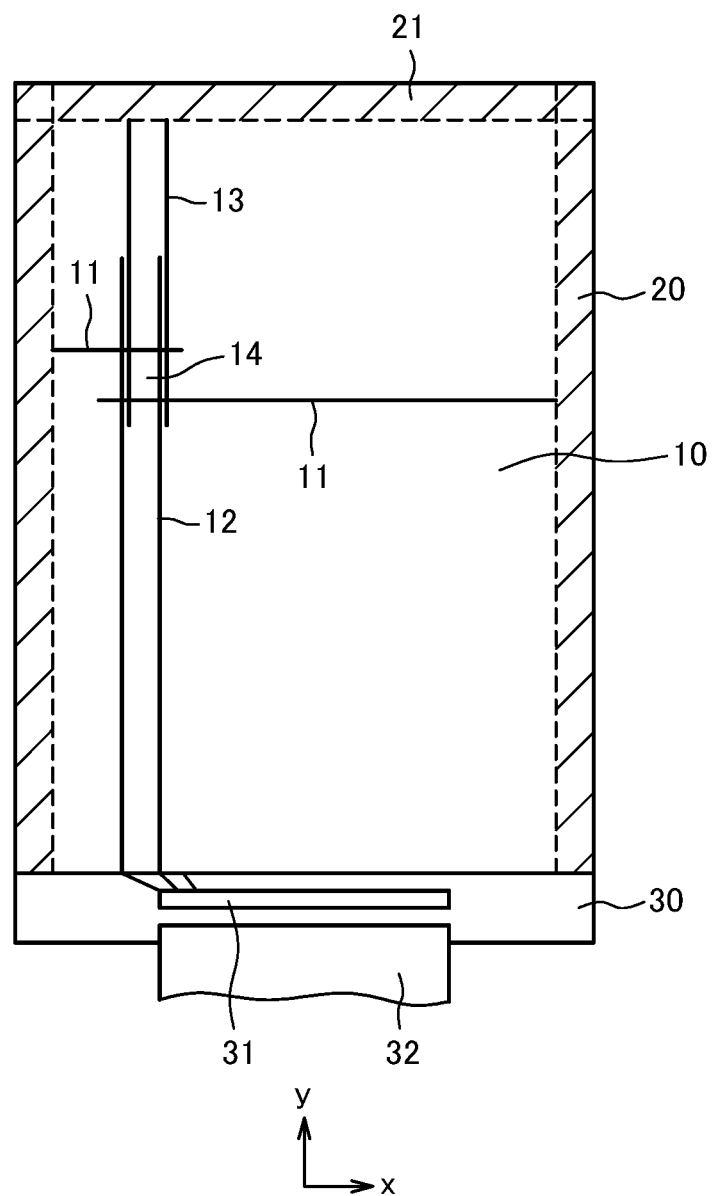
FIG. 1 is a plan view of the organic EL display device.

The scanning line driving circuits 20 are formed at both sides of the display area 10 in FIG. 1. In the display area 10, the scanning lines 11 extend in the lateral direction (x direction) and are arranged in the longitudinal direction (y direction); the video signal lines 12 and the power lines 13 extend in the longitudinal direction and arranged in the lateral direction. The pixel 14 is formed in the area surrounded by the scanning lines 11 and the video signal lines 12 or the power lines 13; the driving transistor and the switching transistor, which are formed by TFTs, and organic EL layer, which emits light, exist in the pixel 14.

The terminal area 30 is formed at one side of the TFT substrate 100. The driver IC 31, which drives the video signal lines 12, is installed in the terminal area 30; the flexible wiring circuit 32, which supplies the power and the signals to the organic EL display device, is connected to the terminal area 30

The display device can be used in a bent state when the TFT substrate is made of glass of a thickness of 0.2 mm or less. The flexible display device is realized when the TFT substrate 100 is made of resin as e.g. polyimide. Polyimide has excellent characteristics for the substrate of the display device because of its mechanical strength and heat resistance and so on. The TFT of the oxide semiconductor can be made with lower process temperature compared with the TFT of the poly-silicon; thus, the TFT of the oxide semiconductor can be formed on the TFT substrate made of resin.

Figure 2:
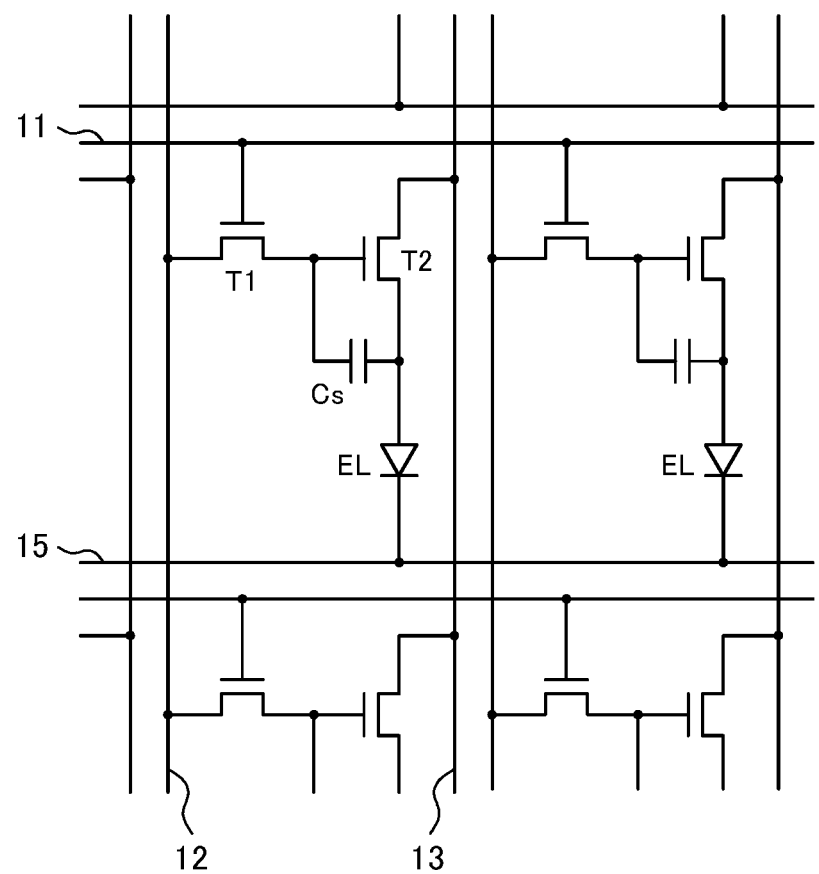
FIG. 2 is an equivalent circuit of the organic EL display device.

FIG. 2 is an example of equivalent circuits of the pixels in an organic EL display device. In FIG. 2, the scanning lines extend in the lateral direction. The cathode lines 15 extend in the lateral direction, however, this is an expression for the equivalent circuit; in the actual device, the cathode line 15 is formed to cover all the display area 10 in a plane shape as explained later. The video signal lines extend in the longitudinal direction and the power lines 13 extend in the longitudinal direction. The pixel is formed in the area surrounded by the scanning lines 11 and the video signal lines 12 or the power lines 13.

In FIG. 2, the drain of the switching transistor T1 connects with the video signal line 12; the gate of the switching transistor T1 connects with the scanning line 11. The drain of the driving transistor T2 connects with the power line 13; the source of the driving transistor T2 connects with the organic EL layer. The gate of the driving transistor T2 connects with the source of the switching transistor T1. The storage capacitor Cs is connected between the gate and the source of the driving transistor T2.

In FIG. 2, when the switching transistor T1 receives the scanning signal, the charge according to the video signal is stored in the storage capacitor Cs through the switching transistor T1; the driving transistor T2 supplies current to the organic EL layer according to the voltage determined by charge in the storage capacitor Cs. The one electrode of the driving transistor T2 corresponds to the one electrode of the storage capacitor Cs. The transistor, which is explained in FIG. 3, is the driving transistor T2.

Figure 3:
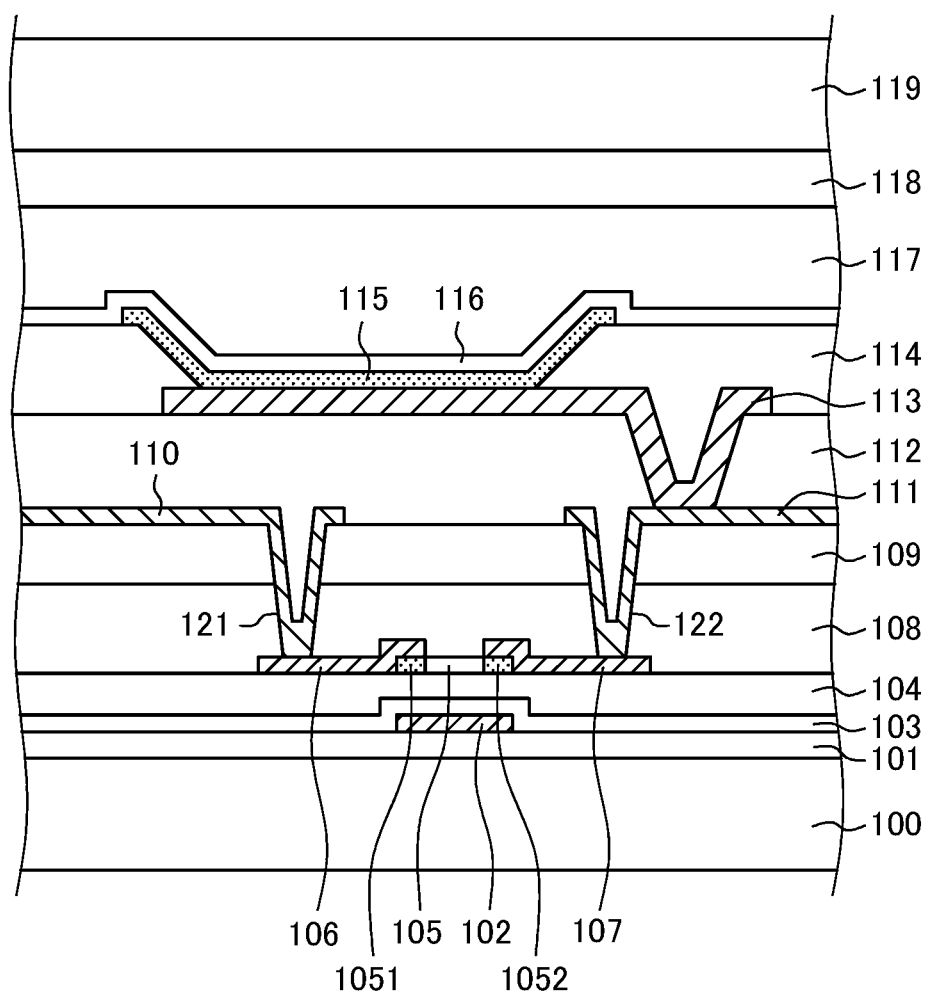
FIG. 3 is a cross sectional view of the organic EL display device.

FIG. 3 is a cross sectional view of the display area 10 of the organic EL display device. The undercoat film 101 is formed on the TFT substrate 100. The undercoat film 101 prevents the oxide semiconductor 105 or the organic EL layer 115 from being contaminated by impurities in the resin substrate or the glass substrate; in addition, the undercoat film 101 improves adherence with the resin substrate or the glass substrate.

The undercoat film 101 is e.g. a laminated structure of the silicon oxide film (SiO film) and the silicon nitride film (SiN film); alternatively, the undercoat film can be a laminated structure of three layers of the SiO film and the SiN film. In this case the SiO film in the lower layer prevents the intrusion of impurities and, at the same time, maintains the adherence with the resin substrate or the glass substrate. The SiN film in the middle layer has an excellent barrier effect specifically against moisture and so on. The upper SiO film has a barrier effect against impurities, at the same time, it improves adherence with a layer formed on the SiO film.

In FIG. 3, the TFT on the undercoat film 101 corresponds to the driving TFT in FIG. 2; the power line side in FIG. 2 corresponds to the drain electrode side in FIG. 3. In FIG. 3, the bottom gate electrode 102 is formed on the undercoat film 101. The bottom gate electrode 102 is made of e.g. a laminated structure of three layers of Ti (100 nm)-Al (300 nm)-Ti (100 nm) when low resistance is required to the bottom gate electrode 102. The bottom gate electrode 102 works as a light shield film for the oxide semiconductor 105. The bottom gate electrode 102 connects with the source of the switching TFT T1 as shown in FIG. 2.

The gate insulating film comprising the first gate insulating film 103 and the second gate insulating film 104 is formed between the bottom gate electrode 102 and the oxide semiconductor 105. The first gate insulating film 103 is formed by e.g. SiN film of a thickness of 200 nm; the second gate insulating film 104 is formed by e.g. SiO film of a thickness of 300 nm. Since a SiN film has a high dielectric constant, it can prevent the break down between the gate electrode and the oxide semiconductor 105 caused by a gate voltage; in addition, the SiN film has an excellent blocking effect against moisture and so on. Since the second gate insulating film 104 contacts with the oxide semiconductor 105 formed on it, it can supply oxygen to the oxide semiconductor 105 and stabilizes the characteristics of the oxide semiconductor 105.

In FIG. 3, the oxide semiconductor 105 is formed on the second gate insulating film 104. The oxide semiconductor 105 is made of e.g. IGZO and formed by sputtering. After the oxide semiconductor 105 is patterned, both sides of the oxide semiconductor 105 are covered either by the first drain electrode 106 or the first source electrode 107. The first drain electrode 106 or the first source electrode 107 is made of e.g. Mo, Ti or Mo alloys. Metals deprive the oxide semiconductor 105 of oxygen, reduce the oxide semiconductor 105, and give conductivity to the oxide semiconductor 105. Namely, the portions of the oxide semiconductor 105 that overlap with the metals become conductive, and form the drain 1051 or the source 1052.

After the first drain electrode 106 and the first source electrode 107 are patterned, the first interlayer insulating film 108 made of SiO is formed on the first drain electrode 106 and the first source electrode 107; then, the second interlayer insulating film 109 of SiN is formed on the first interlayer insulating film 108. Subsequently, the through hole 121 for the second drain electrode 110 and the through hole 122 for the second source electrode 111 are formed penetrating through the first interlayer insulting film 108 and the second interlayer insulting film 109.

After the through holes 121 and 122 are formed, the baking process is applied. In the baking process, the first interlayer insulating film 108 made of SiO and the second gate insulating film 104 made of SiO supply oxygen to the oxide semiconductor 105; thus, stabilizes the characteristics of the oxide semiconductor 105. In the baking process, however, the first gate insulating film 103 made of SiN emits hydrogen. When the hydrogen reaches to the channel, the characteristics of the TFT are changed.

Specifically, the influence of hydrogen becomes bigger when the channel length is shorter; in a sever case, the channel becomes conductive (namely, the TFT is depleted). The inventors found that the through hole 121 and the through hole 122 have an important role for discharging of hydrogen; consequently, the inventors found that the influence of the hydrogen emitted from the first gate insulating film 103 made of SiN to the characteristics of the TFT can be mitigated by specifying the relation between the distance, which is between the through holes 121, 122 and the channel, and the channel length.

In FIG. 3, the second drain electrode 110 is formed in the through hole 121; the second source electrode 111 is formed in the second through hole 122. The organic passivation film 112, which is made of e.g. acrylic resin, is formed covering the interlayer insulating film 109, the second drain electrode 110 and the second source electrode 111. Since the organic passivation film 112 has a role of flattening film, it is made thick as 1.5 μm to 4 μm.

The through hole is formed in the organic passivation film 112 to connect the lower electrode 113 and the source electrode 111. The lower electrode 113 is a laminated film comprising e.g. a lower layer and an upper layer. The lower layer of the lower electrode 113 works as a reflecting electrode, which is made of e.g. a thin film of silver; while the upper layer of the lower electrode 113 works as an anode for the organic EL layer 115. The anode is made of e.g. ITO (Indium Tin Oxide), which is a transparent conductive film.

The bank 114 is formed covering the edge of the lower electrode 113, the organic passivation film 112 and so on. The bank 114 is made of resin as e. g. acrylic resin. The role of the bank 114 is to prevent the organic EL layer 115 formed on the lower electrode 113 from being broken at the step of the edge of the lower electrode 113; another role of the bank 114 is to partition between the pixels. Initially, the film for the bank 114 is formed all over the display area 10; subsequently, holes are formed in the film of the bank to form the organic EL layers 115, which are light emitting layers, in the holes.

In FIG. 3, the organic EL layer 115 is formed on the lower electrode 113 in the hole of the bank 114. The organic EL layer 115 comprises the hole injection layer, the hole transport layer, the light emitting layer, the electron transport layer and the electron injection layer in this order from the lower electrode 113.

The upper electrode 116 is formed on the organic EL layer 115 by a transparent electrode to become the cathode. The upper electrode 116 must be transparent. The upper electrode 116 is made of transparent conductive film as e.g. ITO, IZO (Indium Zinc Oxide) or AZO (Antimony Zinc Oxide); alternatively, it is made of thin film of metal as e.g. silver. Metal can be transparent when it becomes thin film. The upper electrode 116 is formed all over the display area 10 in common to the pixels.

The organic EL layer 115 is weak to moisture, and it is mechanically weak because it is thin. Therefore, the protective film 117, which is a laminated film comprising the inorganic film as the SiN film, the SiO film and the like and the organic film as e.g. acrylic resin, is formed to cover the upper electrode 116. The SiN film works as a barrier against moisture, the organic film works as a mechanical buffer, and the SiO film works as a barrier as well as to improve adherence with other films.

The display area of the organic EL display device reflects the external light since the organic EL display device has a reflective film in it. The reflection of the external light deteriorates visibility of the display. Therefore, the organic EL display device of FIG. 3 has the circular polarizing film 119 on the display surface via adhesive 118.

Figure 4:
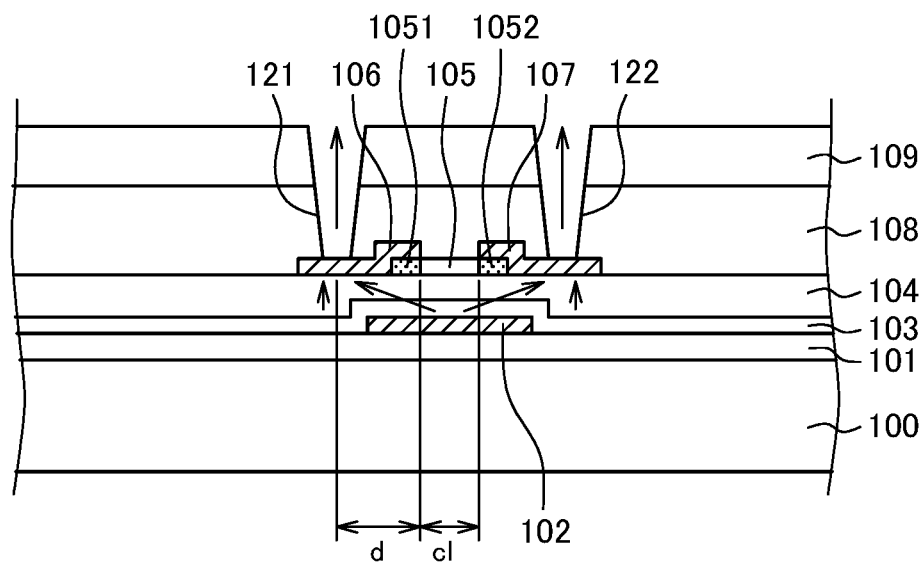
FIG. 4 is a cross sectional view that explains the function of the present invention.
Figure 5:
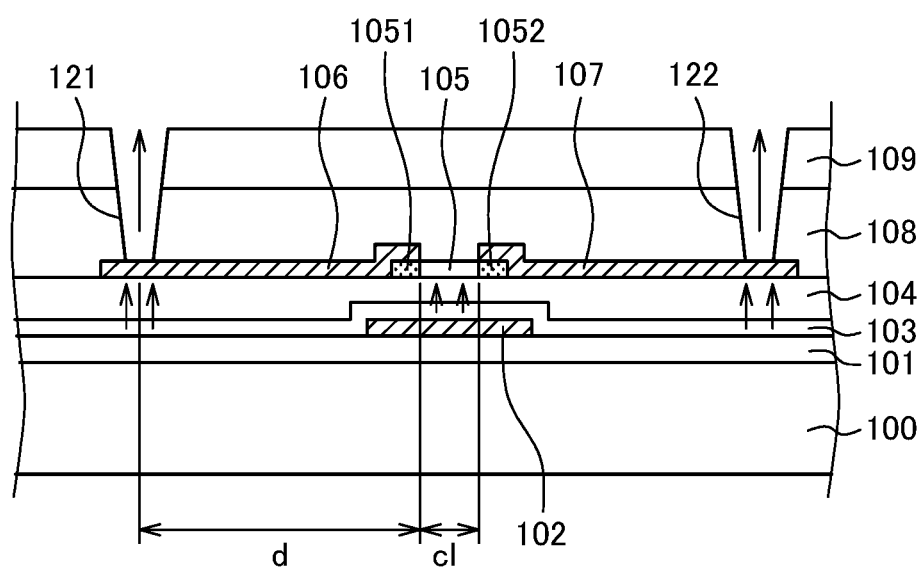
FIG. 5 is another cross sectional view that explains the function of the present invention.

FIG. 4 and FIG. 5, which are cross sectional views in the vicinity of the TFTs, explain the function of the present invention. FIG. 4 is the case that the through holes 121 and 122 are located near the channel 105. The structure of FIG. 4 is the same as explained in FIG. 3. Namely, the bottom gate electrode 102 is covered by the first gate insulating film 103 of SiN, the second gate insulating film 104 of SiO is formed on the first gate insulating film 103; subsequently, the oxide semiconductor 105 is formed on the second gate insulating film 104. The first drain electrode 106 and the first source electrode 107 are formed on each side of the oxide semiconductor 105; the first interlayer insulating film 108 of SiO and the second insulating film 109 of SiN are formed over the oxide semiconductor 105.

The through holes 121 and 122 are formed penetrating the first interlayer insulating film 108 and the second interlayer insulating film 109; subsequently, the baking process is applied. In the baking process, hydrogen is emitted from the first gate insulating film 103 of SiN. If the hydrogen reaches to the channel, the oxide semiconductor 105 is reduced, which results a sever influence on the characteristics of the TFT. Specifically, the influence is bigger when the channel length is shorter. When the TFT substrate is made of resin, the resin also emits hydrogen, thus, the influence of the hydrogen becomes further severe.

In FIG. 4, through holes 121 and 122 are formed in the vicinity of the channel, thus, the hydrogen can diffuse into the through holes; consequently, the influence of the hydrogen to the channel can be suppressed. The arrows in FIG. 4 show direction of diffusion of the hydrogen. In the structure of FIG. 4, the channel length can be reduced.

In FIG. 4, a distance between the through hole and the channel is defined as a distance d between the center of the through hole 121 and the edge of the channel 105. For example, if d is less than 20 μm, the channel length c1 can be less than 4 μm. By the way, in FIG. 4, there exists the first drain electrode 106 and the first source electrode 107, which are made of metals, at the bottoms of the through holes 121 and 122. The hydrogen, however, penetrates the metals, thus, the first drain electrode 106 and the first source electrode 107 do not block the hydrogen.

FIG. 5 shows the through holes 121 and 122 exist apart from the channel 105. In this structure, in the vicinity of the channel of the TFT, in the baking process after the first interlayer insulating film 108 and the second interlayer insulating film 109 are formed, the hydrogen, emitted from the first gate insulating film made of SiN, does not have a way to escape; thus, the hydrogen goes to the channel; consequently, the characteristics of the channel change. The arrows in FIG. 5 are directions the hydrogen diffuses.

Concretely, in FIG. 5, when the distance d between the center of the through hole 121 and the edge of the channel becomes 20 μm or more, the influence of the hydrogen to the channel becomes bigger. In the case of FIG. 5, the channel length c1 is necessary to be 4 μm or more. The influence of hydrogen can be suppressed if the channel length is long enough.

Figure 6:
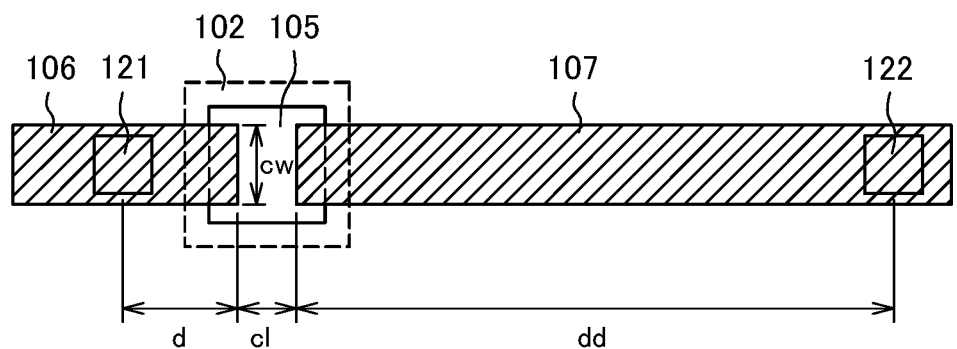
FIG. 6 is a plan view of the TFT which the characteristics are measured.

FIGS. 8 through 11 are data that evaluate the influence of hydrogen, namely, evaluating the relation between the channel length c1 and the distance d between the through hole and the channel. FIG. 6 is a plan view of the TFT that the characteristics were measured. In FIG. 6, the location of the through hole 121 at the drain electrode 106 side and the location of the through hole 122 at the source electrode 107 side is not symmetrical with respect to the channel. Since the distance dd between the channel and the through hole 122 in the source electrode side 107 is so big that the influence of the through hole 122 does not appear to the characteristics of the TFT. On the contrary, the distance d between the channel and the through hole 121 in the drain electrode 106 side is so short; therefore, several data can be taken changing the distance d. In FIG. 6, the channel length c1 is 3 μm and channel width cw is 4 μm.

Figure 7:
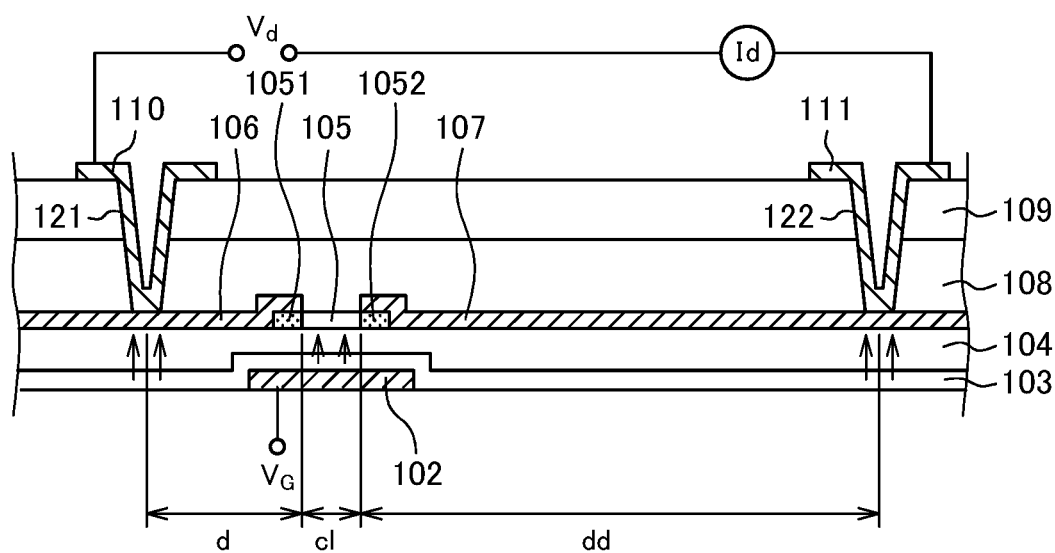
FIG. 7 is a cross sectional view of the TFT which the characteristics are measured.

FIG. 7 is a cross sectional view corresponding to FIG. 6. The layer structure of FIG. 7 is the same as explained in FIGS. 3, 4 and 5. In FIG. 7, the through hole 122 at the side of the source electrode 107 is far from the channel 105, thus, the influence of the through hole 122 does not exist. In FIG. 7, the distance d between the through hole 121 and the channel 105 at the side of the drain electrode 106 is short, thus, data are taken by changing the distance d. In FIG. 7, voltage Vg is applied to the gate electrode 102, drain voltage Vd is applied to between the drain electrode 106 and the source electrode 107 to measure drain current Id.

Figure 8:
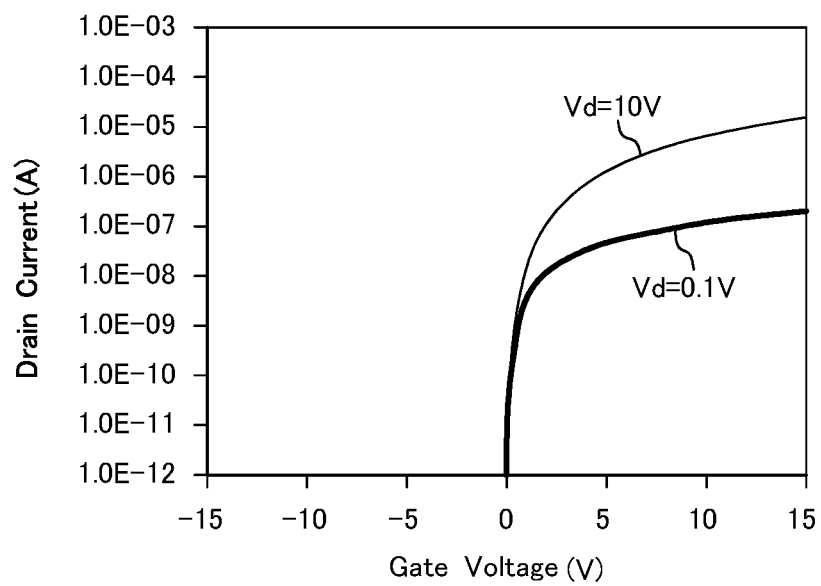
FIG. 8 is a graph of the Vg-Id characteristics of the TFT when no influence of hydrogen exists.
Figure 18:
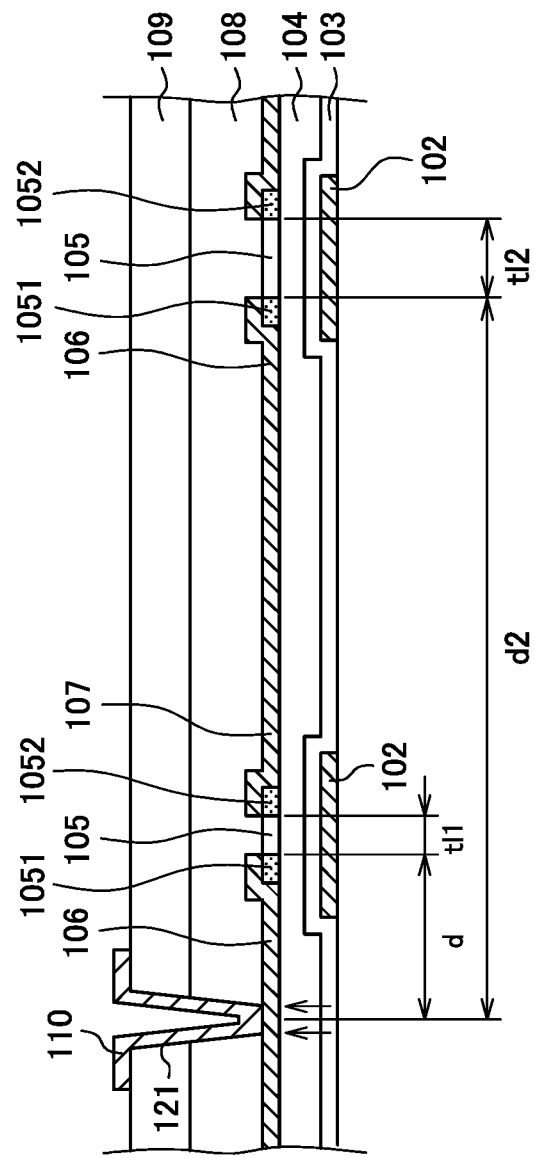
FIG. 18 is a cross sectional view of an example of the second embodiment.

FIG. 8 is a graph that shows the relation between Vg and Id with parameter Vd where influence of hydrogen does not exist. In FIG. 18, the abscissa is gate voltage Vg (V), the ordinate is drain current Id (A). The ordinate is in log scale. Data were taken when Vd is 10 V and 0.1 V. As shown in FIG. 8, if there is no influence of hydrogen, drain current Id increases from the point where the gate voltage Vg is near zero volt; and a change in the threshold voltage is not observed.

Figure 9:
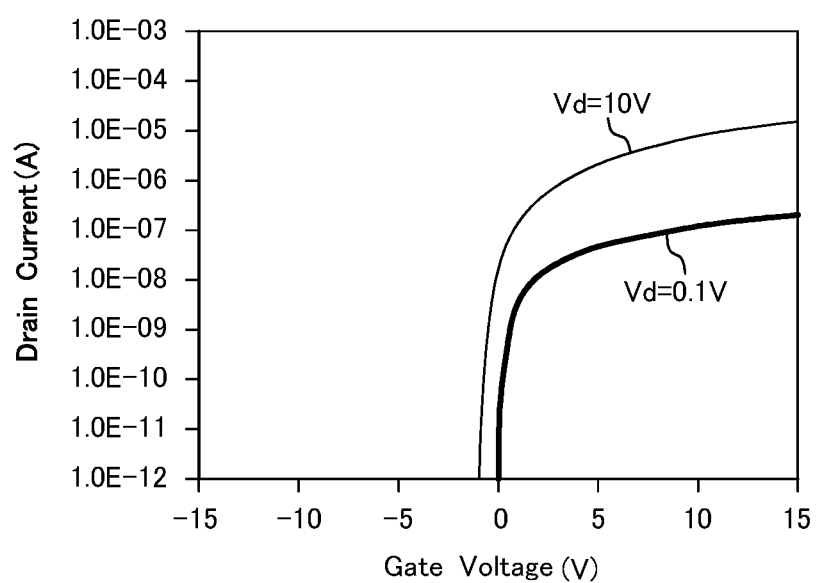
FIG. 9 is a graph of the Vg-Id characteristics of the TFT when limited influence of hydrogen exists.

FIG. 9 is a graph that shows the relation between Vg and Id with parameter Vd where influence of hydrogen emitted from the first gate insulating film 103 made of SiN exists, wherein the distance between the center of the through hole 121 and the edge of the channel is less than 20 μm. Concretely, the distance d between the center of the through hole 121 and the edge of the channel is 15 μm. The channel width and the channel length are as shown in FIG. 6. The abscissa and the ordinate of FIG. 9 is the same as FIG. 8. In FIG. 9, when Vd is 0.1 V, drain current Id increases from the point where the gate voltage Vg is near zero volt; and a change of the threshold voltage is not observed; namely, the characteristics are the same as FIG. 8, in which no influence of hydrogen exists.

In FIG. 9, when the drain voltage Vd is 10 V, the threshold voltage is changed; however, the value is 1V or less. Such change in threshold voltage is called as DIBL (Drain Induced Barrier Lowering). By the way, the drain voltage Vd of the TFT of the actual product is 5 V in maximum; thus, 1 V or less in DIBL under 10 V of drain voltage is allowable.

Figure 10:
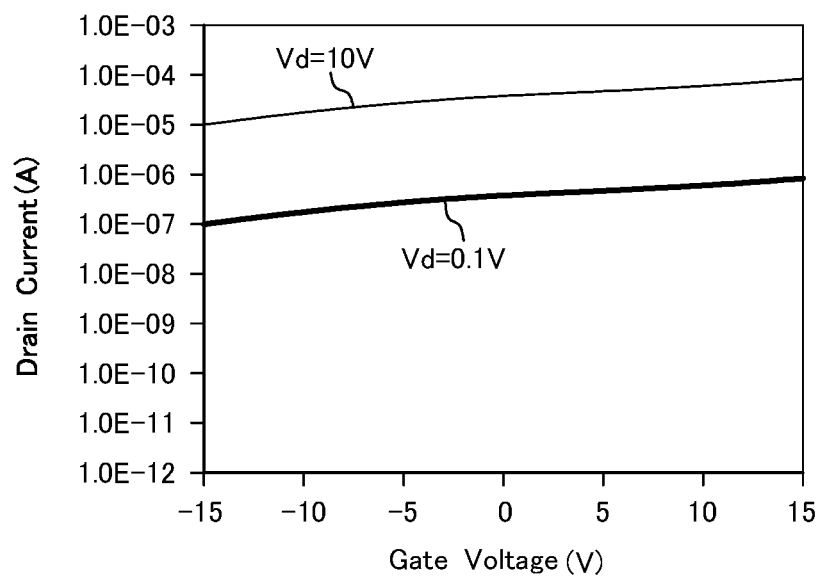
FIG. 10 is a graph of the Vg-Id characteristics of depleted TFT caused by influence of hydrogen.

FIG. 10 is a graph that shows the relation between Vg and Id with parameter Vd where influence of hydrogen emitted from the first gate insulating film 103 made of SiN exists, wherein the distance between the center of the through hole 121 and the edge of the channel is 20 µm or more. Concretely, the distance d between the center of the through hole 121 and the edge of the channel is 25 µm. As explained in FIG. 5, if the distance d between the through hole and the channel is big, the hydrogen, emitted from the first gate insulating film made of SiN, does not have a way to escape; thus, the influence of hydrogen becomes severe. The channel width and the channel length of the TFT measured in FIG. 10 are the same as shown in FIG. 6.

The abscissa and the ordinate of FIG. 10 is the same as explained in FIG. 8. In FIG. 10, the channel is conductive in both cases that gate voltage is 0.1 V and 10V, namely, the TFT is depleted. This is caused by that the oxide semiconductor at the channel is reduced by hydrogen; consequently, the conductance is given to the channel. Therefore, the TFT of FIG. 10 cannot drive the display device.

Figure 11:
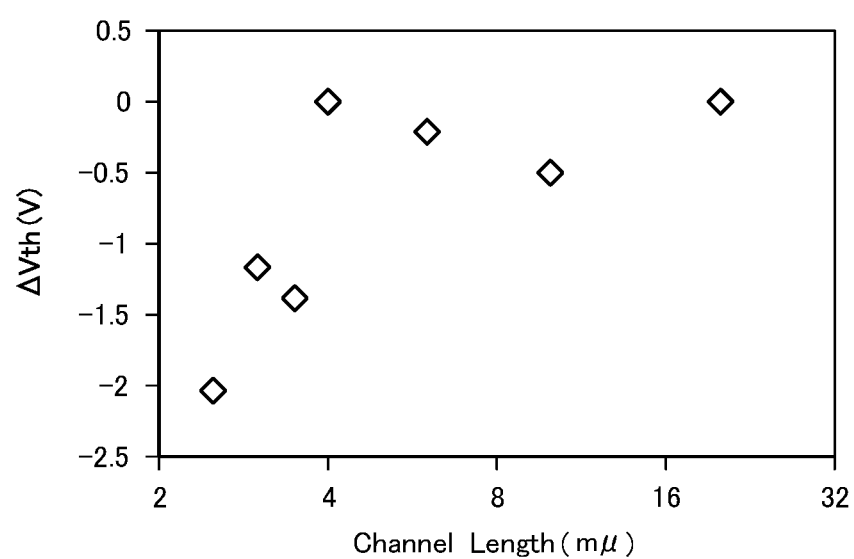
FIG. 11 is a graph that shows the change of the characteristics of the TFT between the channel length and the threshold voltage under the influence of hydrogen.

FIG. 11 is data that show the relation between the channel length and deviation of threshold voltage under the influence of the hydrogen emitted from the first gate insulating film 103 made of SiN. Concretely, FIG. 11 shows the change of threshold voltage when the channel length c1 is changed under the condition that the distance d between the through hole 121 and the channel 105 is 25 µm as shown in FIG. 6. Channel width is maintained constant as 5 µm. Since the distance d in FIG. 6 is 25 µm, the influence of the through hole to the channel does not exist.

According to the channel length becomes bigger the influence of hydrogen to the channel becomes smaller. For example, if the channel length is 20 µm, the influence of hydrogen is neglected. FIG. 11 shows at what value of the channel length, the influence of hydrogen to the channel appears under the condition that hydrogen cannot escape through the through hole.

In FIG. 11, the threshold voltage decreases when the channel length is less than 4 µm; for example, when the channel length is 3.5 µm, the threshold voltage changes approximately 1.4 V. On the other hand, if the channel length is 4 µm or bigger, the influence of hydrogen can be neglected even if the diffusion of hydrogen to the through hole cannot be expected.

FIG. 11 is the data under the structure that distance d in FIG. 6 or FIG. 7 is 25 µm. If the distance d is less than 20 µm, the influence of hydrogen is mitigated, consequently the change in the threshold voltage is suppressed in a small value.

Figure 12:
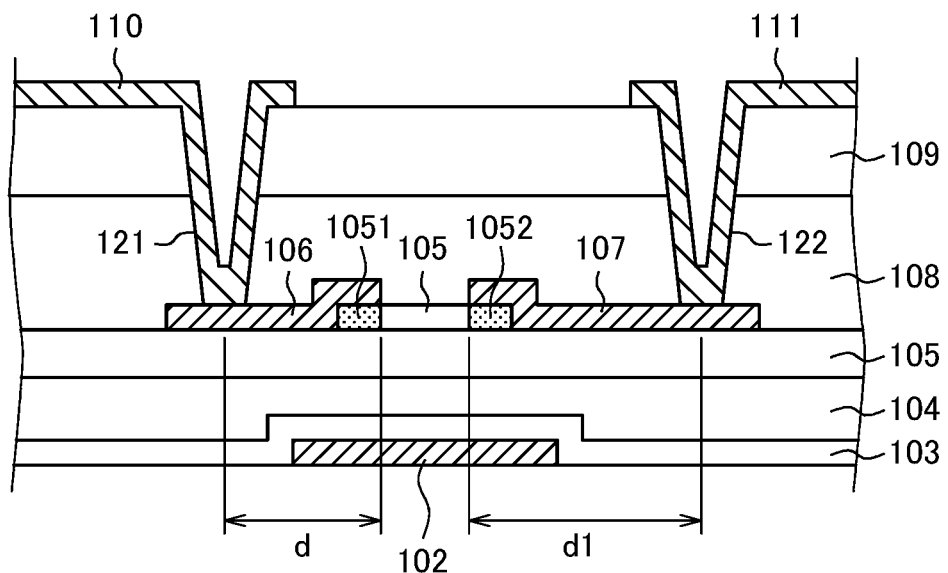
FIG. 12 is a cross sectional view of the TFT formed by oxide semiconductor.

By the way, in the real products, the through hole 121 for the second drain electrode 110 and the through hole 122 for the source electrode 111 are not always located in a symmetrical position with respect to the channel 105; FIG. 12 is the example of this case. In FIG. 12, the through hole 121 for the drain electrode 106 is nearer to the channel than the through hole 122 for the source electrode 107 is. Namely, the relation is d<d1 in FIG. 12. In this case, d in FIG. 12 is used for the distance between the channel 105 and the through hole because the through hole that is nearer to the channel 105 has more influence for the characteristics of the channel.

Figure 13:
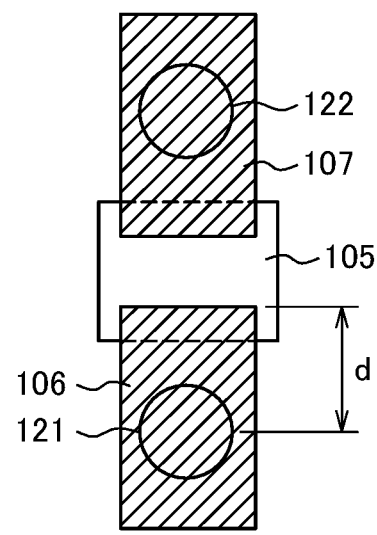
FIG. 13 is a plan view that shows a definition of the distance d which represents the distance between the center of the through hole and the edge of the channel.
Figure 14:
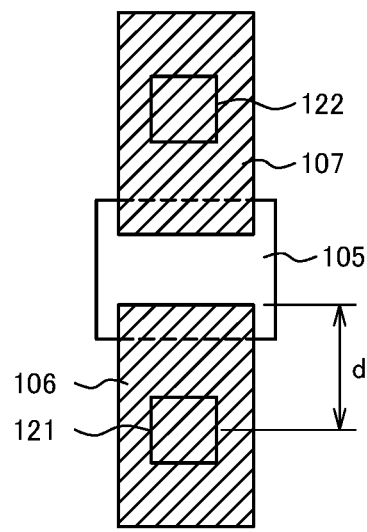
FIG. 14 is another plan view that shows a definition of the distance d which represents the distance between the center of the through hole and the edge of the channel.
Figure 15:
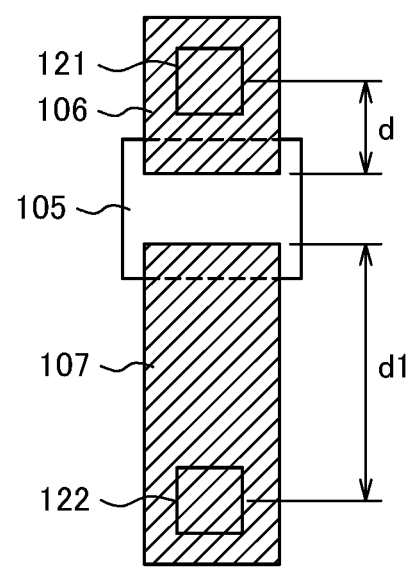
FIG. 15 is yet another plan view that shows a definition of the distance d which represents the distance between the center of the through hole and the edge of the channel.

The distance d is a distance between the center of the through hole 121 and the edge of the channel 105; however, there are several cases in a plan view. FIG. 13 shows when plan views of the through hole 121 and through hole 122 are circle. FIG. 14 shows when plan views of the through hole 121 and through hole 122 are square. FIG. 15 shows plan views of through holes 121 and 122 are square; however, the distance d1 between the through hole 121 and the channel 105 is bigger than the distance d between the through hole 122 and the channel 105. In this case, distance d is used as the distance between the through hole and the channel.

Figure 16:
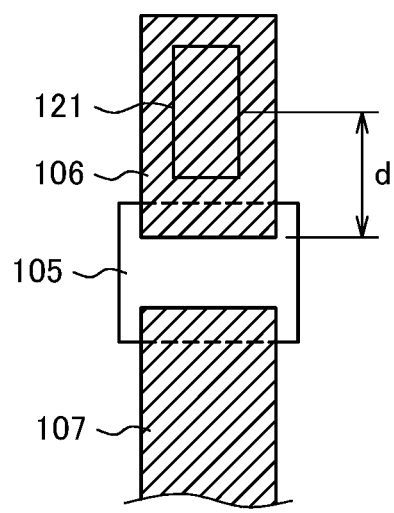
FIG. 16 is yet another plan view that shows a definition of the distance d which represents the distance between the center of the through hole and the edge of the channel.
Figure 17:
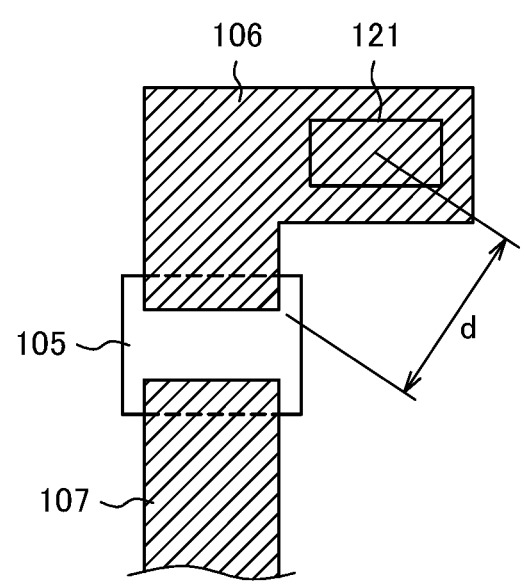
FIG. 17 is yet another plan view that shows a definition of the distance d which represents the distance between the center of the through hole and the edge of the channel.

FIG. 16 shows when the plan view of the through hole 121 is rectangle. In this case, too, the distance between the center of the rectangular and the edge of the channel 105 is defined as the distance d. FIG. 17 shows the first drain electrode 106 is bent; the rectangle through hole 121 is formed at the bent portion of the first drain electrode 106. In this case the distance d is defined as the distance between the center of the rectangle 121 and the nearest channel 105.

The shape of the TFT is varied according to a requirement of layout. In that case, the channel length of the TFT is determined according the distance between the channel and the center of the through hole for the drain electrode or the source electrode; consequently, the high efficient and high reliable display device can be realized.

Second Embodiment

The first embodiment explained the example to change the channel length according to the positions of the through hole for the drain electrode 121 or the through hole for the source electrode 122 for a single TFT. In the practical products, however, not all the TFTs have both of the through hole for the drain electrode 121 and the through hole for the source electrode 122. For example, FIG. 18 shows the structure that the first TFT of the left hand side and the second TFT of the right hand side are serially connected. FIG. 18 is a simplified structure for explanation of the invention.

In FIG. 18, there is only one through hole 121 for the drain electrode 121 of the first TFT. The first TFT connects with the second TFT; there is no through hole in the vicinity of the second TFT. In the case of FIG. 18, the distance d between the through hole 121 and the channel of the first TFT is less than 20 µm; therefore, the channel length t11 of the first TFT can be made less than 4 µm.

On the other hand, if the distance d2 between the through hole 121 and the channel of the second TFT is more than 20 µm, the channel length t12 should be 4 µm or more. In other words, the display device of high reliability can be realized by designing the TFTs according to the above explained principle.

In FIG. 18, the channel length t11 of the first TFT, which is nearer to the through hole 121, can be shorter, thus, more current can flow the first TFT. Therefore, the display device of high efficiency and high-performance can be realized by assigning the first TFT as the driving TFT.

Third Embodiment

Figure 19:
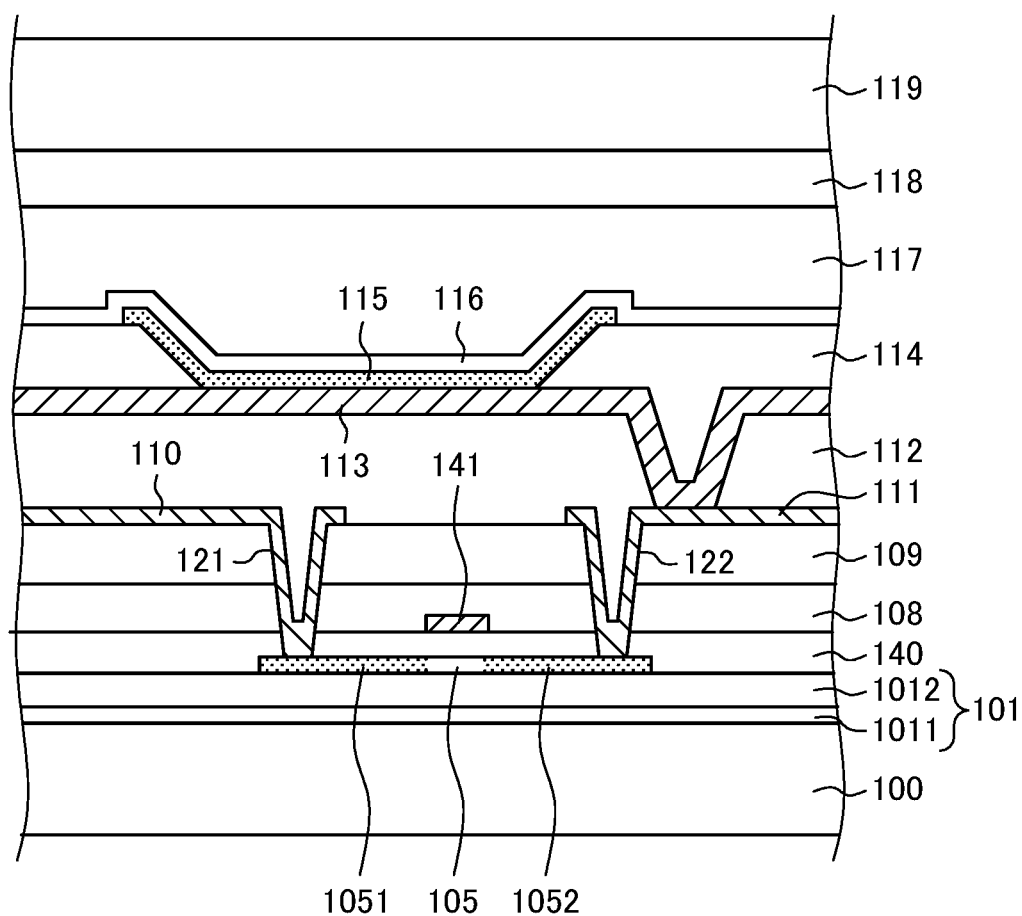
FIG. 19 is a cross sectional view of the top gate type TFT in the organic EL display device according to the third embodiment.

The first embodiment and the second embodiment were explained when the TFT was bottom gate type. The present invention can be applied to the TFT of top gate type, too. FIG. 19 is a cross sectional view of the organic EL display device when the TFT is top gate type. The structure of the TFT of FIG. 19 is different from the structure of the TFT of FIG. 3.

In FIG. 19, the undercoat film 101 is formed on the TFT substrate 100; the undercoat film 101 of FIG. 19 has the structure that the lower layer is SiN film 1011 and the upper layer is SiO film 1012. Both films are formed by CVD. The SiN film 1011 is indispensable because it blocks moisture; however, SiN film 1011 emits hydrogen in the baking process after the first interlayer insulating film 108 and the second interlayer insulating film 109 are formed in the later process. This hydrogen influences the channel 105 of the oxide semiconductor. By the way, the undercoat film can be a three structure layer, in which the SiN film is sandwiched by the SiO layers; however, the SiN film still exists in this structure, thus, the problem of emission of hydrogen from the SiN film is the same.

The oxide semiconductor 105 is formed on the undercoat film 101 by sputtering. The third gate insulating film 140 is formed covering the oxide semiconductor 105. By the way, the term of the third gate insulating film 140 is used only to differentiate the name from the first gate insulating film and the second gate insulating film of the first embodiment. The third gate insulating film 140 is made of SiO, which supplies oxygen to the channel of the oxide semiconductor 105 to stabilize the characteristics of the TFT.

The top gate electrode 141 is formed on the third gate insulating film 140. The top gate electrode 141 can be made of Mo or Mo alloy; if lower resistance is required, the top gate electrode 141 can be made of Al film sandwiched by Ti films. After the gate electrode 141 is formed, the ion implantation of either one of Argon (Ar), Phosphor (P), or Boron (B) is applied to the oxide semiconductor 105 using the top gate electrode 141 as the mask to give conductivity to the oxide semiconductor to form the drain 1051 and the source 1052.

Subsequently, the first interlayer insulating film 108 of SiO and the second interlayer insulating film 109 of SiN are formed by CVD. This structure is the same as the bottom gate type TFT. After that, the first through hole 121 for the drain electrode 110 and the second through hole 122 for the source electrode 111 are formed penetrating through the second interlayer insulating film 109, the first interlayer insulating film 108 and the third gate insulating film 140. The subsequent processes are the same as explained in the first embodiment.

After the first through hole 121 and the second through hole 122 are formed through the second interlayer insulating film 109, the first interlayer insulating film 108 and the third gate insulating film 140, the baking process is applied to activate the oxide semiconductor 105 as explained in the first embodiment. In the third embodiment, too, the SiN film formed by CVD exists in the undercoat film 101 under the oxide semiconductor 105; therefore, hydrogen is emitted from the SiN film during the baking process. In addition, if the TFT substrate 100 is formed by resin, hydrogen is emitted to the oxide semiconductor 105 from the resin. Therefore, the influence of hydrogen is the same as the case of bottom gate type.

Figure 20:
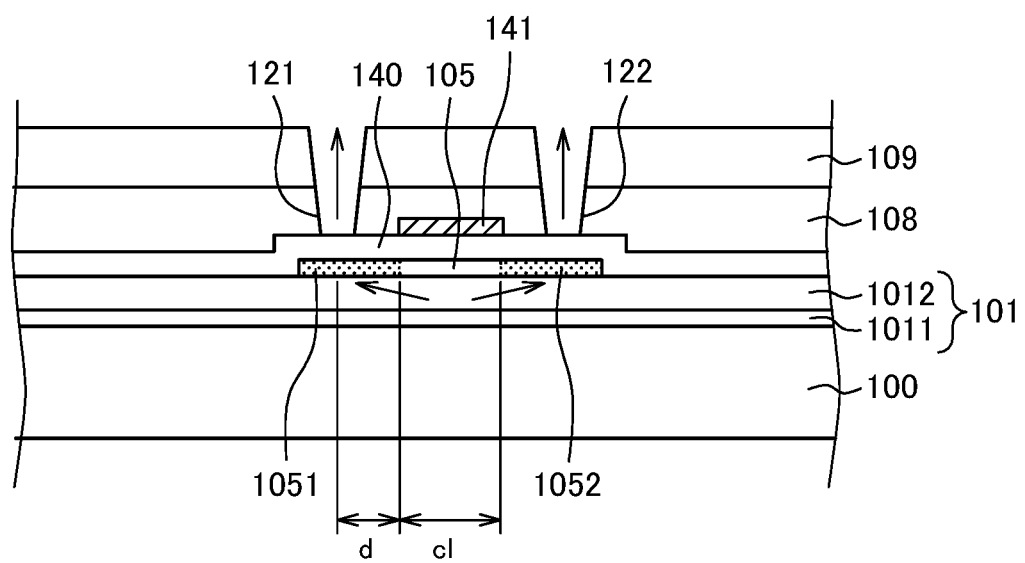
FIG. 20 is a cross sectional view of the top gate type TFT that shows the function of the present invention.

FIG. 20 is the case the through hole 121 and the through hole 122 exist at the vicinity of the channel 105. Concretely, the distance d between the edge of the channel 105 and the center of the through holes 121 or the center of the through hole 122 is less than 20 µm. In this case, the hydrogen emitted from the SiN film, which is formed under the channel 105, can diffuse into the through holes 121 and 122; thus, influence of hydrogen is suppressed. Consequently, the channel length c1 can be shorter than 4 µm.

Figure 21:
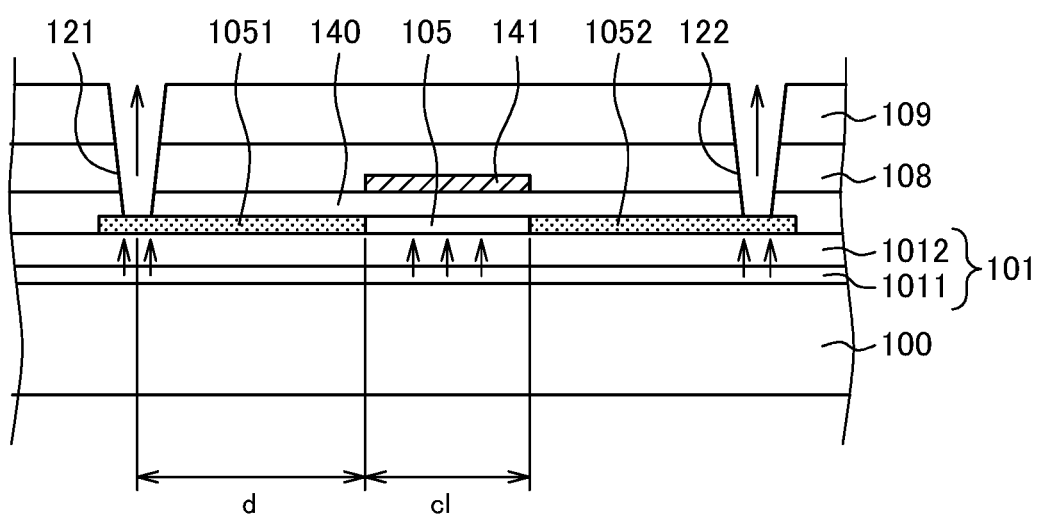
FIG. 21 is another cross sectional view of the top gate type TFT that shows the function of the present invention.

FIG. 21 is the case the through hole 121 and the through hole 122 exist far from the channel 105. Concretely, the distance d between the edge of the channel 105 and the centers of the through holes is 20 µm or more. In this case, the hydrogen emitted from the SiN film under the oxide semiconductor 105 does not have a way to exit; thus, the hydrogen diffuses to the channel 105, and the characteristics of the TFT are influenced. In such a case, the channel length c1 needs to be set 4 µm or more since the influence of hydrogen is mitigated when the channel length c1 becomes longer.

Figure 22:
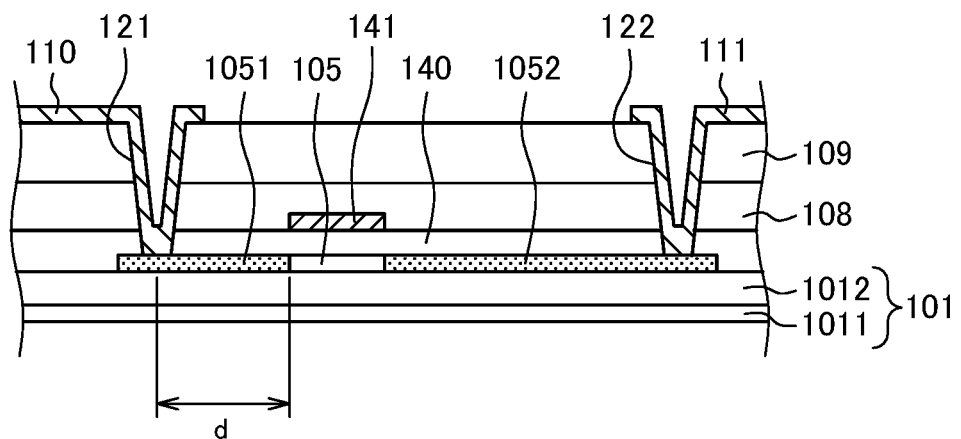
FIG. 22 is an enlarged cross sectional view of the top gate type TFT.

FIG. 22 is a cross sectional view that the distance between the channel 105 and the through hole 121 for the drain electrode 110 and the distance between the channel 105 and the through hole 122 for the source electrode 111 are different. In this case, the distance d between the channel 105 and the center of the through hole is defined by the shorter one, namely, the distance between the channel 105 and the center of the through hole 121 s defined as the distance d in FIG. 22.

By the way, the oxide semiconductor 105 can be made in a thickness of 10 nm to 100 nm; however, in most cases, it is formed as thin as 20 nm to 50 nm. The through hole 121 and the through hole 122 are formed penetrating through three layers by dry etching. If the selective ratio of etching gas in the dry etching is not big enough, the oxide semiconductor 105 also disappears when the through holes 121 and 122 are formed.

Figure 23:
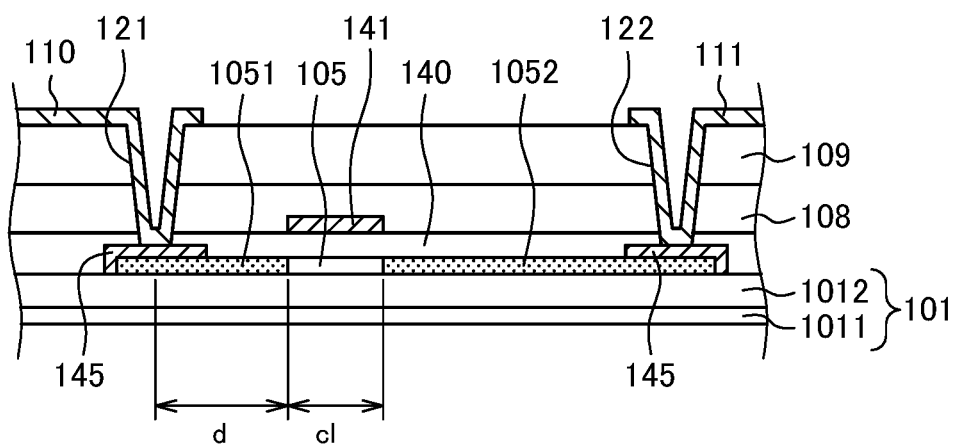
FIG. 23 is another enlarged cross sectional view of the top gate type TFT.

FIG. 23 is a structure that prevents this phenomenon. In FIG. 23, the etching stoppers 145 made of metal are formed between the through hole 121 and the oxide semiconductor 1051 and between the through hole 122 and the oxide semiconductor 1052. Since hydrogen can go through metal, the diffusion of hydrogen to the through holes 121 and 122 are not hindered.

Figure 24:
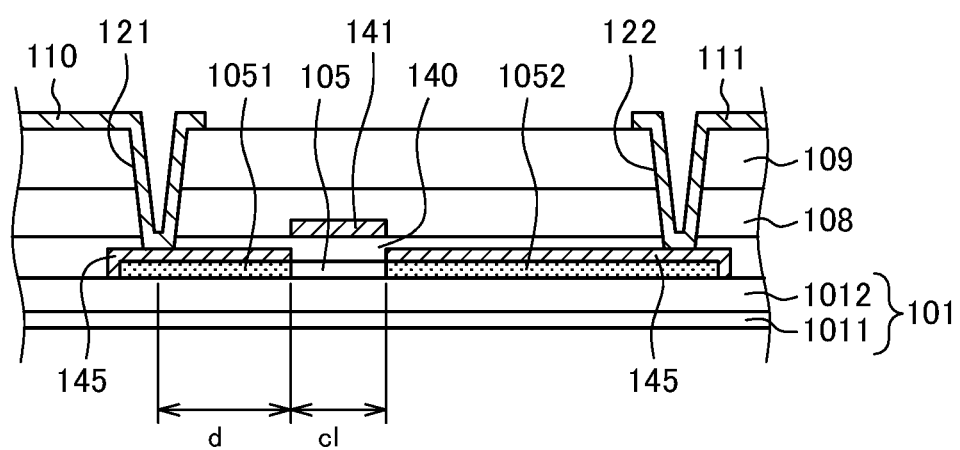
FIG. 24 is yet another enlarged cross sectional view of the top gate type TFT.

By the way, the drain 1051 and the source 1052 of the oxide semiconductor 105 in FIG. 22 and FIG. 23 are given conductivity by ion implantation. In such a structure, the resistance of the drain and the source may increase in long time operation. FIG. 24 shows the etching stoppers 1045 made of metal covers the drain 1051 and the source 1052. Since metal deprives the oxide semiconductor 105 of oxygen, the etching stoppers 145 on the drain 1051 and the source 1052 prevent the increase of resistance of the drain 1051 and the source 1052. In this case, too, the relation between the channel length c1 and the distance d between the edge of the channel 105 and the center of the through hole is the same as in the case of FIG. 22 and FIG. 23.

Fourth Embodiment

Figure 25:
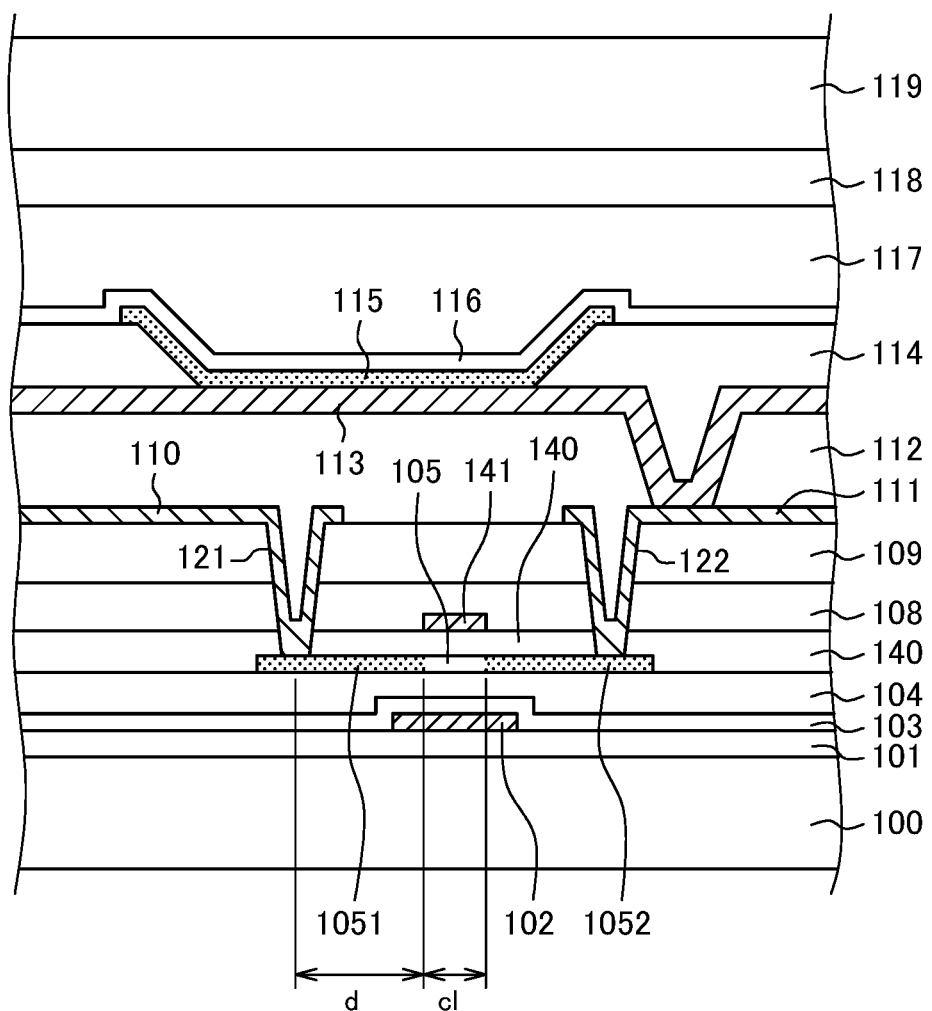
FIG. 25 is a cross sectional view that shows the definition of distance d between the center of the through hole and the edge of the channel in the dual gate type TFT according to the fourth embodiment.

The TFT of the oxide semiconductor 105 can be a so called dual gate type, in which the gate electrodes exist at upper side and lower side of the oxide semiconductor 105. FIG. 25 is a cross sectional view of the dual gate type TFT. In FIG. 25, the structure up to the second gate insulating film 104 is the same as FIG. 3 of the first embodiment. In FIG. 25, the oxide semiconductor 105 is formed on the second gate insulating film 104; the third gate insulating film 140 is formed on the oxide semiconductor 105; and the top gate electrode 141 is formed on the third gate insulating film 140.

In FIG. 25, the width of the bottom gate electrode 102 is wider than the width of the top gate electrode 141. In this case, the bottom gate electrode 102 has a role as a light shield film for the TFT. In FIG. 25, the drain 1051 and the source 1052 are formed through ion implantation using the top gate 141 as a mask. This structure is the same as FIG. 19 of the third embodiment. Namely, the channel length cl is determined by the top gate electrode 141. Thus, the relation between the channel length c1 and the distance d between the edge of the channel and the center of the through hole is the same as in the third embodiment.

Figure 26:
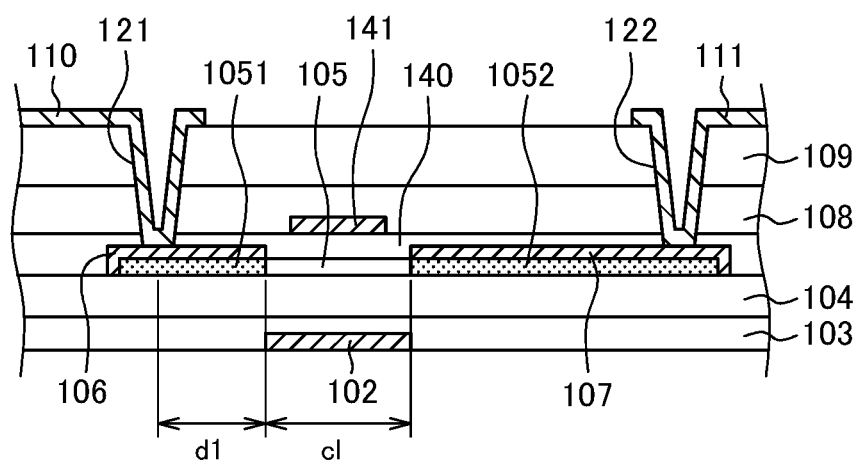
FIG. 26 is another cross sectional view that shows the definition of distance d between the center of the through hole and the edge of the channel in the dual gate type TFT according to the fourth embodiment.

FIG. 26 is the case the channel length c1 is determined by the first drain electrode 106 and the first source electrode 107 that cover the oxide semiconductor, not by ion implantation using the top gate 141 as the mask. The definition of the relation between the channel length cl and the distance d between the edge of the channel 105 and the center of the through hole is the same as in the case of the first embodiment.

Fifth Embodiment

Figure 27:
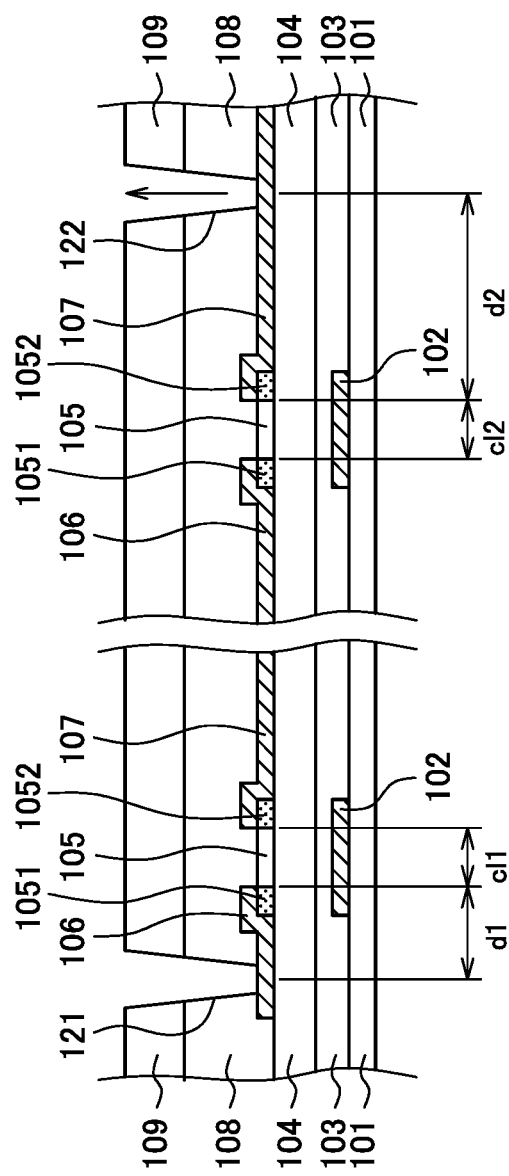
FIG. 27 is a cross sectional view of the TFT according to the fifth embodiment.

FIG. 27 is a cross sectional view of the fifth embodiment. In the structure of organic EL display device, there are the first TFT and the second TFT in one pixel; the first TFT and the second TFT are covered by the first interlayer insulating 108 and the second interlayer insulating film 109 (herein after a combination of the first interlayer insulating film 108 and the second interlayer insulating film 109 is simply called the interlayer insulating film in this embodiment). In the first TFT, the first through hole 121 is formed in the interlayer insulating film; in the second TFT, the second through hole 122 is formed in the interlayer insulating film In the first TFT, the distance between the center of the through hole 121 and the edge of the channel is d1; and the channel length is c11. In the second TFT, the distance between the center of the through hole 122 and the edge of the channel is d2; and the channel length is c12. Wherein d1<d2. In this case, the channel length c11 of the first TFT can be shorter than the channel length c12 of the second TFT. The reason is that the influence of hydrogen can be mitigated in the first TFT as explained in the first embodiment.

Figure 28:
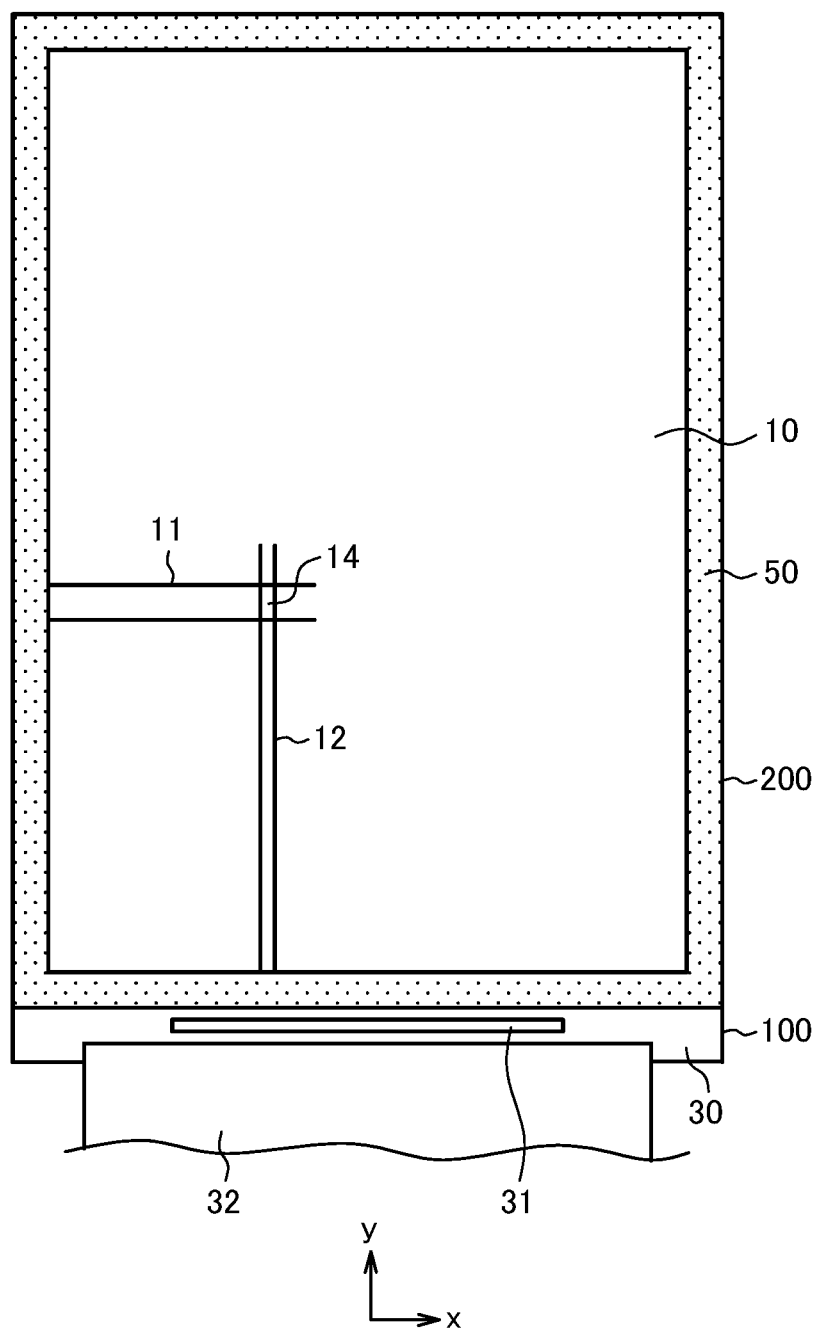
FIG. 28 is a plan view of the liquid crystal display device.

In the case of the organic EL display device, there are the driving TFT and the switching TFT; more current flows in the driving TFT. The less channel length of the TFT can flow more current. Therefore, it is reasonable to use the first TFT as the driving TFT. In other words, if the channel length of one TFT of the two TFTs must be longer than that of another TFT, it is reasonable to configure the layout so that the TFT of shorter channel length is assigned to the driving TFT, Sixth Embodiment The present invention is applicable to the liquid crystal display device, too. In general, one TFT is formed in one pixel in the liquid crystal display device. The TFT of oxide semiconductor is used in the liquid crystal display device, too. FIG. 28 is a plan view of the liquid crystal display device. In FIG. 28, the TFT substrate 100 and the counter substrate 200 adhere to each other via the seal material 50; the liquid crystal is sealed inside.

The display area 10 is formed in the area where the TFT substrate 100 and the counter substrate 200 overlap. In the display area 10, the scanning lines 11 extend in the lateral direction and are arranged in the longitudinal direction; the video signal lines extend in the longitudinal direction and are arranged in the lateral direction. The pixel 14 is formed in the area surrounded by the scanning lines 11 and the video signal lines 12. The driver IC 31 is installed on the terminal area 30 and the flexible wiring circuit 32 connects to the terminal area 30.

Figure 29:
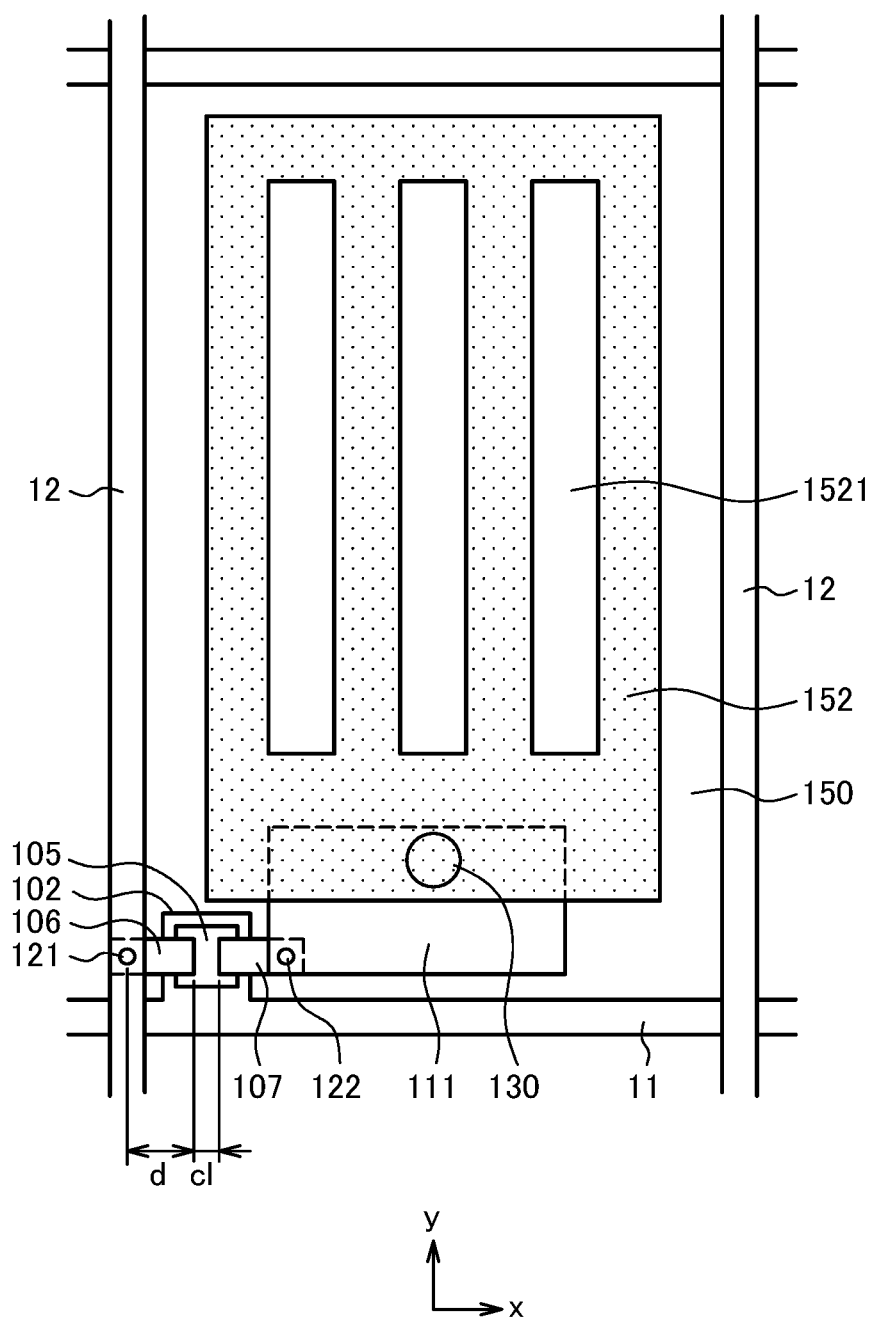
FIG. 29 is a plan view of the pixel of the liquid crystal display device.

FIG. 29 is a plan view of the pixel in the display area 10. In FIG. 29, the scanning lines 11 extend in the lateral direction; the video signal lines extend in the longitudinal direction. The pixel electrode 152 is formed in the area surrounded by the scanning lines 11 and the video signal lines 12. The common electrode 150 is formed under the pixel electrode 152 via the insulating film. There are three slits 1521 in the pixel electrode 152.

The TFT of the oxide semiconductor 105 is formed at the corner of the pixel. The first drain electrode 106 is formed on the drain of the oxide semiconductor 105; the first drain electrode 106 connects with the video signal line 12 via through hole 121. The first source electrode 107 is formed on the source of the oxide semiconductor 105; the first source electrode 107 connects with the second source electrode 111 via the through hole 122.

The second source electrode 111 extends to the pixel electrode 152, and connects with the pixel electrode 152 through the through hole 130. In FIG. 29, the video signal line 12 works as the second drain electrode; the branch of the scanning line 11 constitutes the bottom gate electrode 102.

Figure 30:
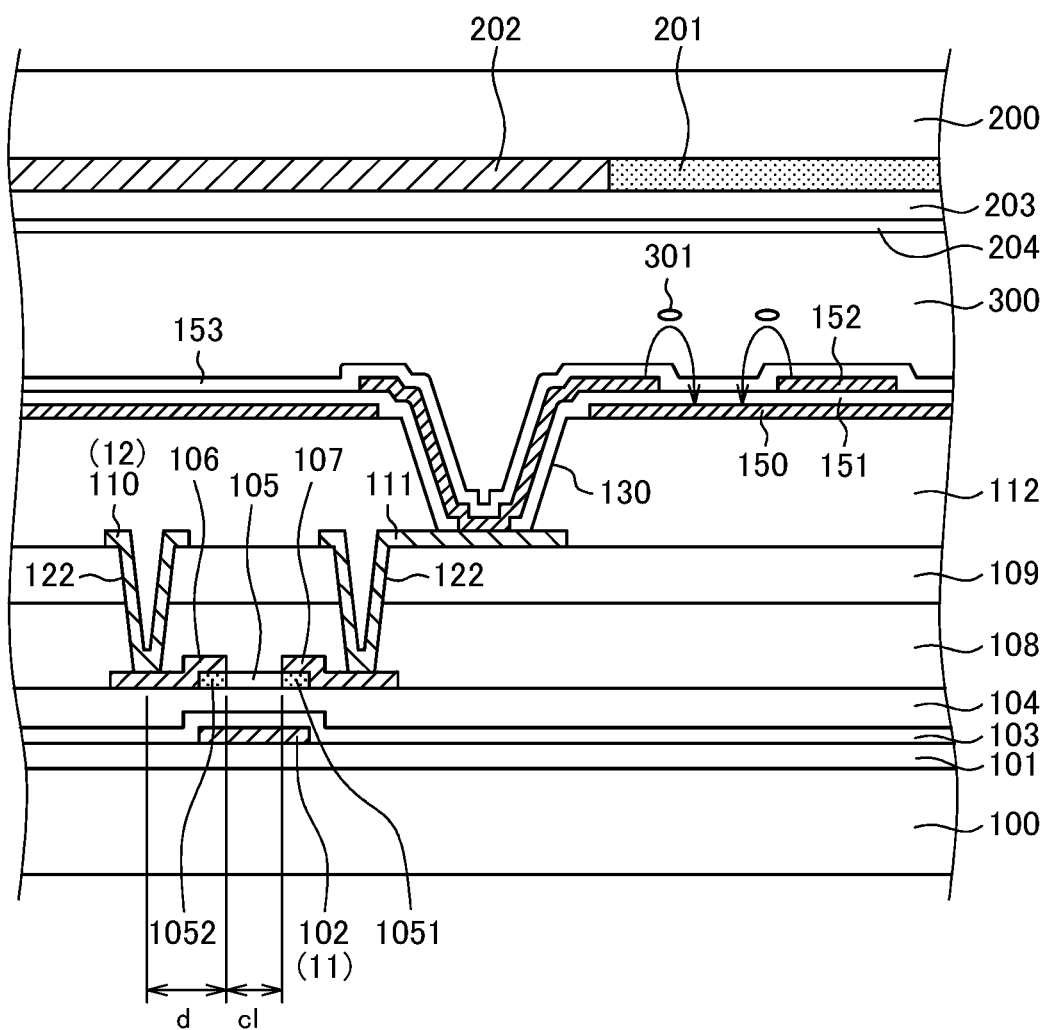
FIG. 30 is a cross sectional view of the pixel of the liquid crystal display device.

FIG. 30 is a cross sectional view of the liquid crystal display device corresponding to FIG. 29. As shown in FIG. 30, the structure is the same as FIG. 3 of the organic EL display device up to the formation of the organic passivation film 112. Thus, the content of the first embodiment of the present invention is applicable to the liquid crystal display device.

In FIG. 30, the common electrode 150 is formed in a plane shape on the organic passivation film 112. The capacitive insulating film 151 made of SiN is formed on the common electrode 150; the pixel electrode 152 is formed on the capacitive insulating film 151. An example of the shape of the pixel electrode 152 is shown in FIG. 29. The pixel electrode 152 connects with the second source electrode 111 via the through hole 130, formed in the organic passivation film 112 and via the through hole of the capacitive insulating film 151 in the through hole 130. The alignment film 153 is formed covering the pixel electrode 152.

In FIG. 30, the counter substrate 200 is located over the TFT substrate 100 sandwiching the liquid crystal layer 300. The color filter 201 and the black matrix 202 are formed inside of the counter substrate 200; the over coat film 203 is formed covering the color filter 201 and the black matrix 202. The alignment film 204 is formed on the over coat film 203. In FIG. 30, when the voltage is applied between the pixel electrode 152 and the common electrode 150, the line of force as shown by arrows is generated, and the line of force rotates the liquid crystal molecules 301; thus, a transmittance of the liquid crystal layer 300 is controlled. The transmittance of the liquid crystal layer is controlled in each of the pixel; consequently, the video image is generated.

In FIG. 29 and FIG. 30, the channel length of the TFT is cl; the distance between the through hole 121 in the drain side and the edge of the channel 105 is d. The relation between the channel length cl and the distance d is the same as explained in the first embodiment.

Figure 31:
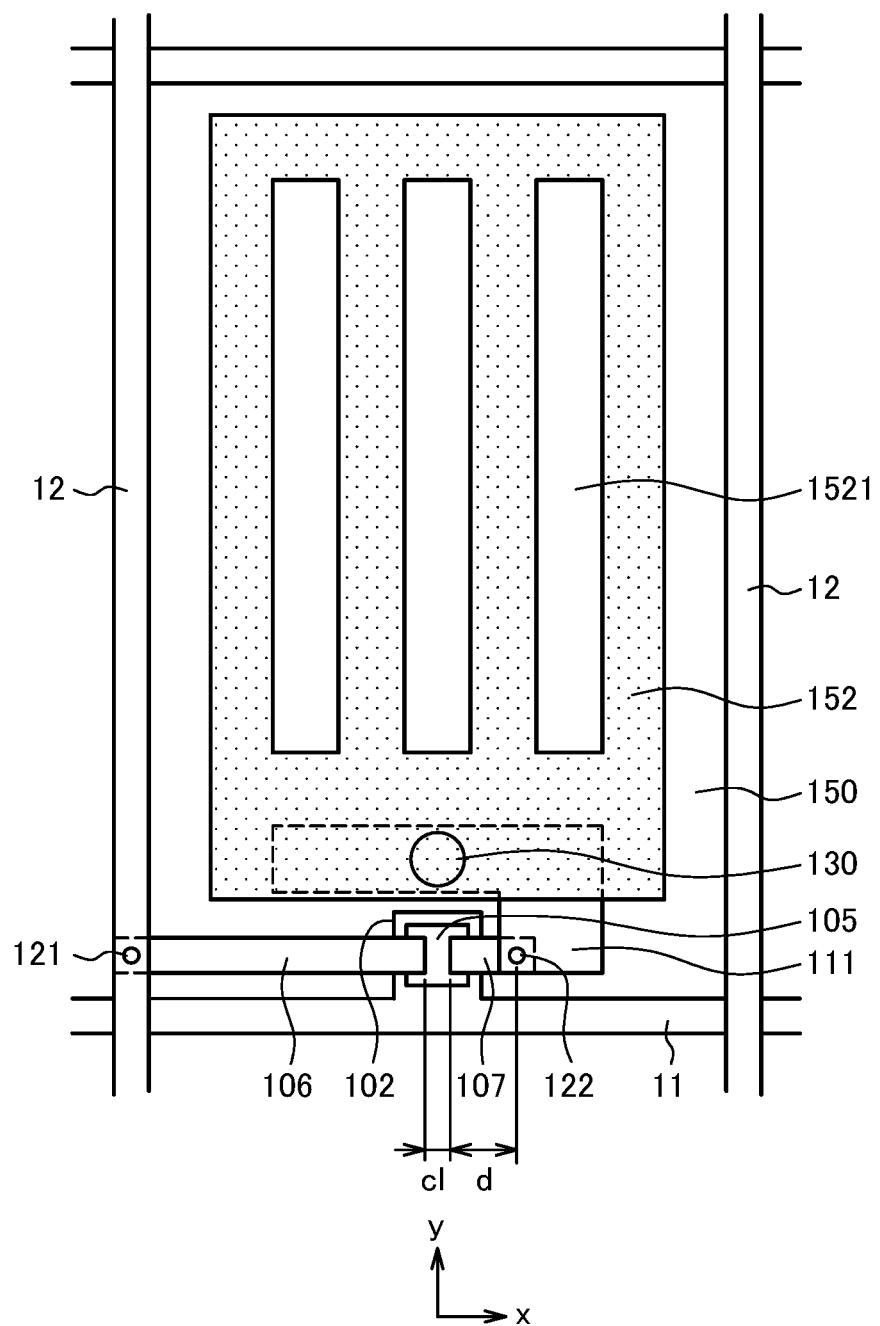
FIG. 31 is a plan view of another structure of the pixel of the liquid crystal display device.

The TFT is located at the corner of the pixel in FIG. 29, however, as shown in FIG. 31, the TFT may be set at the center of the pixel in the x direction according to the requirement of the layout. In such a case, for example, the first drain electrode 106 becomes longer; consequently, the distance between the through hole 121 and the edge of the channel becomes bigger. Even in such a case, the channel length can be maintained short by setting the distance d between the through hole 122 in the first source electrode 107 side and the edge of the channel 105 short.

Figure 32:
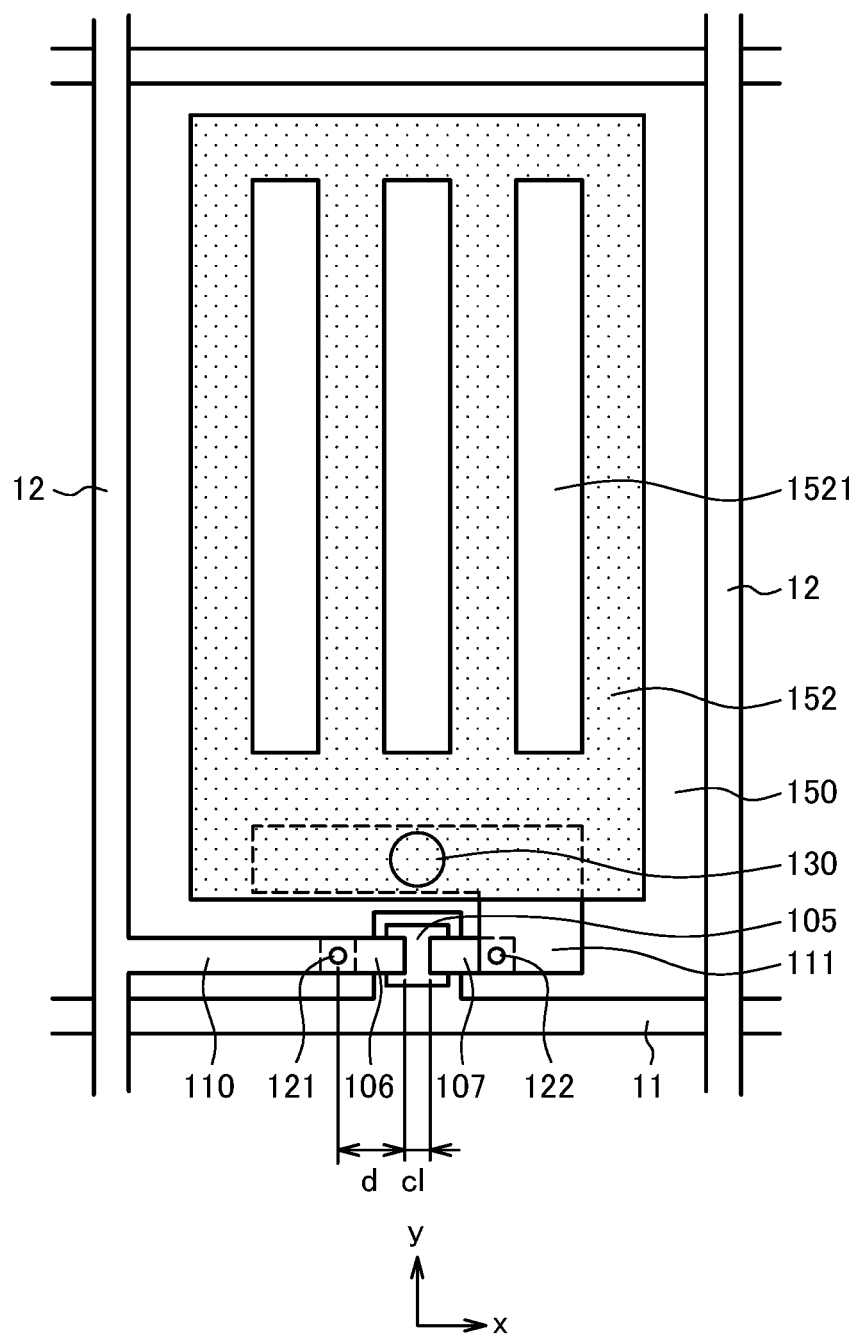
FIG. 32 is a plan view of yet another structure of the pixel of the liquid crystal display device.

FIG. 32 is another example to set the TFT at the center of the pixel in the x direction. In FIG. 32, the branch of the video signal line 12, which works as the second drain electrode, is made longer, thus, the distance d between the through hole 121 for connecting the first drain electrode 106 and the edge of the channel 105 can be shorter. Consequently, the channel length of the TFT can be set less than 4 μm. On the other hand, if the structures exemplified by FIG. 31 or FIG. 32 cannot be adopted, namely, if the distance between the edge of the channel 105 and the center of the through hole is bigger than 20 μm, the channel length of the TFT is to be set more than 4 μm.

What is claimed is:

1. A display device comprising:
    a display area including a plurality of pixels, each of the pixels having a first TFT and a second TFT;
    the first TFT and the second TFT comprise an oxide semiconductor;
    the first TFT and the second TFT are covered by an interlayer insulating film;
    a first through hole is formed in the interlayer insulating film to connect a drain of the first TFT;
    a distance between a center of the first through hole and an edge of a channel of the first TFT is shorter than a distance between the center of the first through hole and an edge of a channel of the second TFT;
    a channel length of the first TFT is shorter than a channel length of the second TFT; and
    the distance between the center of the first through hole and the edge of the channel of the second TFT is 20 μm or more.

2. The display device according to claim 1,
    wherein a gate electrode of the first TFT and a source of the second TFT are connected to each other.

3. The display device according to claim 1,
    wherein a silicon nitride film is formed below the oxide semiconductor of the first TFT and the second TFT, and
    a silicon oxide film, formed in contact with the oxide semiconductor, is formed between the oxide semiconductor and the silicon nitride film.

4. The display device according to claim 3,
    wherein the silicon nitride film is formed by CVD.

5. The display device according to claim 3,
    wherein the first TFT is bottom gate type, and
    a bottom gate is formed under the silicon nitride film.

6. The display device according to claim 3,
    wherein the first TFT is top gate type,
    a gate insulating film is formed with a second silicon oxide film, and
    the first through hole is formed through the gate insulating film.

7. The display device according to claim 1,
    wherein the first TFT and the second TFT are formed on a resin substrate.

8. The display device according to claim 1,
    wherein the channel length of the first TFT is less than 4 μm, the channel length of the second TFT is 4 μm or more.

* * * * *